United States Patent
Lee et al.

(10) Patent No.: US 10,528,255 B2
(45) Date of Patent: Jan. 7, 2020

(54) INTERFACE FOR NON-VOLATILE MEMORY

(71) Applicant: SanDisk Technologies LLC, Plano, TX (US)

(72) Inventors: Jiwang Lee, San Jose, CA (US); Anil Pai, San Jose, CA (US); Tianyu Tang, Milpitas, CA (US); Ravindra Arjun Madpur, Bangalore (IN); Amandeep Kaur, Bangalore (IN); Ragul Kumar Krishnan, Bangalore (IN); Venkata Kolagatla, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 285 days.

(21) Appl. No.: 15/365,944

(22) Filed: Nov. 30, 2016

(65) Prior Publication Data
US 2018/0136843 A1    May 17, 2018

(30) Foreign Application Priority Data
Nov. 11, 2016 (IN) .............................. 201641038622

(51) Int. Cl.
*G06F 3/06* (2006.01)
*G11C 16/08* (2006.01)
(Continued)

(52) U.S. Cl.
CPC .......... *G06F 3/0604* (2013.01); *G06F 3/0658* (2013.01); *G06F 3/0659* (2013.01);
(Continued)

(58) Field of Classification Search
CPC .... G06F 3/0659; G06F 3/0613; G06F 3/0679; G11C 16/08
See application file for complete search history.

(56) References Cited

U.S. PATENT DOCUMENTS

| 5,022,004 A | 6/1991 | Kurtze et al. |
| 5,548,795 A | 8/1996 | Au |
| (Continued) | | |

OTHER PUBLICATIONS

JEDEC Standard, Low Power Double Data Rate 3 (LPDDR3), JESD209-3, May 2012, Arlington, VA.
(Continued)

*Primary Examiner* — Getente A Yimer
(74) *Attorney, Agent, or Firm* — Vierra Magen Marcus LLP

(57) ABSTRACT

Apparatuses, systems, methods, and computer program products are disclosed for accessing non-volatile memory. An apparatus includes one or more memory die. A memory die includes an array of non-volatile memory cells, a set of ports, and an on-die controller. The set of ports includes a first port and a second port. The first port includes a first plurality of electrical contacts and the second port includes a second plurality of electrical contacts. The on-die controller communicates via the set of ports to receive command and address information and to transfer data for a data operation on the array of non-volatile memory cells. The on-die controller uses the first port and the second port in a first mode and uses the first port without the second port in a second mode. The second mode provides compatibility with an interface of a legacy type of memory die.

20 Claims, 9 Drawing Sheets

(51) Int. Cl.
*G11C 16/10* (2006.01)
*G11C 16/26* (2006.01)

(52) U.S. Cl.
CPC ............ *G06F 3/0679* (2013.01); *G11C 16/08* (2013.01); *G11C 16/10* (2013.01); *G11C 16/26* (2013.01)

(56) References Cited

U.S. PATENT DOCUMENTS

| | | | |
|---|---|---|---|
| 5,664,114 | A | 9/1997 | Krech, Jr. et al. |
| 5,951,635 | A | 9/1999 | Kamgar |
| 6,091,663 | A | 7/2000 | Kim et al. |
| 6,166,564 | A | 12/2000 | Rosen |
| 6,216,178 | B1 | 4/2001 | Stracovsky et al. |
| 6,263,410 | B1 | 7/2001 | Kao et al. |
| 6,385,129 | B1 | 5/2002 | Silvestri |
| 6,393,512 | B1 | 5/2002 | Chen et al. |
| 6,393,534 | B1 | 5/2002 | Chen et al. |
| 6,504,768 | B1 | 1/2003 | Roohparvar et al. |
| 6,567,321 | B2 | 5/2003 | Lee |
| 6,614,798 | B1 | 9/2003 | Bishop et al. |
| 6,628,563 | B1 | 9/2003 | Hsu et al. |
| 6,769,050 | B1* | 7/2004 | Ware ................ G06F 13/1684 711/149 |
| 6,778,445 | B2 | 8/2004 | Ooishi et al. |
| 6,912,598 | B1 | 6/2005 | Bedarida et al. |
| 7,038,952 | B1 | 5/2006 | Zack et al. |
| 7,038,953 | B2 | 5/2006 | Aoki |
| 7,184,508 | B2 | 2/2007 | Emberling |
| 7,254,688 | B2 | 8/2007 | Uneme |
| 7,277,982 | B2 | 10/2007 | Calvignac et al. |
| 7,310,396 | B1 | 12/2007 | Sabih |
| 7,499,364 | B2 | 3/2009 | Ahn et al. |
| 7,562,193 | B2* | 7/2009 | Floman ................ G11C 7/1045 365/230.05 |
| 7,831,801 | B1* | 11/2010 | Anderson ................ G06F 13/28 712/11 |
| 7,889,580 | B2 | 2/2011 | Millar et al. |
| 7,970,977 | B1 | 6/2011 | Li et al. |
| 8,019,950 | B1* | 9/2011 | Warshofsky ........ G06F 13/1678 710/310 |
| 8,041,885 | B2* | 10/2011 | Jo ...................... G06F 12/0246 711/103 |
| 8,327,057 | B1 | 12/2012 | Venkatramani |
| 8,612,651 | B2 | 12/2013 | Boonstra et al. |
| 8,656,093 | B1 | 2/2014 | Edmondson et al. |
| 8,832,324 | B1 | 9/2014 | Hodges et al. |
| 8,914,589 | B2 | 12/2014 | Gregorius et al. |
| 8,924,680 | B2 | 12/2014 | Perego et al. |
| 9,087,568 | B1 | 7/2015 | Ware |
| 9,285,824 | B2 | 3/2016 | Zhu et al. |
| 9,851,905 | B1 | 12/2017 | Ramalingam et al. |
| 9,858,976 | B2 | 1/2018 | Ikegami et al. |
| 10,114,586 | B1 | 10/2018 | Benisty |
| 10,254,967 | B2 | 4/2019 | Ouyang et al. |
| 2001/0036105 | A1 | 11/2001 | Takata |
| 2002/0159294 | A1 | 10/2002 | Kato |
| 2003/0120861 | A1 | 6/2003 | Calle et al. |
| 2004/0027856 | A1 | 2/2004 | Lee et al. |
| 2004/0027857 | A1 | 2/2004 | Ooishi |
| 2004/0057282 | A1 | 3/2004 | Cernea |
| 2004/0057283 | A1 | 3/2004 | Cernea |
| 2004/0060031 | A1 | 3/2004 | Cernea |
| 2004/0156235 | A1 | 8/2004 | Bellini et al. |
| 2005/0071547 | A1 | 3/2005 | Lin |
| 2005/0114556 | A1 | 5/2005 | Solomon |
| 2005/0273543 | A1 | 12/2005 | Middleton et al. |
| 2006/0140007 | A1 | 6/2006 | Cernea et al. |
| 2008/0005424 | A1 | 1/2008 | Raines |
| 2008/0094871 | A1 | 4/2008 | Parkinson |
| 2008/0109627 | A1 | 5/2008 | Toyama et al. |
| 2008/0151648 | A1 | 6/2008 | Eilert et al. |
| 2008/0225625 | A1 | 9/2008 | Parkinson et al. |
| 2009/0157985 | A1 | 6/2009 | Stevens et al. |
| 2009/0240873 | A1 | 9/2009 | Yu et al. |
| 2010/0100668 | A1 | 4/2010 | Huang |
| 2010/0100669 | A1 | 4/2010 | Huang |
| 2010/0103723 | A1 | 4/2010 | Kawai et al. |
| 2010/0185703 | A1 | 7/2010 | Yionen |
| 2011/0041039 | A1 | 2/2011 | Harari et al. |
| 2011/0051518 | A1 | 3/2011 | Fujimura |
| 2011/0051519 | A1 | 3/2011 | Lee et al. |
| 2011/0060875 | A1* | 3/2011 | Haukness ............... G11C 16/10 711/103 |
| 2011/0069526 | A1 | 3/2011 | Schuette |
| 2011/0072200 | A1 | 3/2011 | Lee et al. |
| 2011/0072201 | A1 | 3/2011 | Lee et al. |
| 2011/0119425 | A1* | 5/2011 | Kollipara ............ G06F 13/1668 710/307 |
| 2011/0208905 | A1 | 8/2011 | Shaeffer et al. |
| 2012/0033496 | A1 | 2/2012 | Yano et al. |
| 2012/0066439 | A1 | 3/2012 | Fillingim |
| 2012/0210041 | A1 | 8/2012 | Flynn et al. |
| 2012/0213012 | A1 | 8/2012 | Johnson et al. |
| 2012/0250411 | A1 | 10/2012 | Abiko et al. |
| 2012/0260032 | A1 | 10/2012 | Chiu et al. |
| 2013/0054885 | A1* | 2/2013 | Choi ....................... G11C 8/16 711/105 |
| 2013/0188482 | A1 | 7/2013 | Lee |
| 2013/0232296 | A1 | 9/2013 | Yonezawa et al. |
| 2013/0246716 | A1 | 9/2013 | Kato et al. |
| 2014/0019672 | A1 | 1/2014 | Harasawa et al. |
| 2014/0075233 | A1 | 3/2014 | Bartling et al. |
| 2014/0250260 | A1 | 9/2014 | Yap |
| 2015/0186075 | A1 | 7/2015 | Roberts |
| 2016/0092223 | A1 | 3/2016 | Wang et al. |
| 2016/0124639 | A1 | 5/2016 | Hyun et al. |
| 2017/0199668 | A1 | 7/2017 | Ouyang et al. |
| 2017/0262192 | A1 | 9/2017 | Aga et al. |
| 2018/0024948 | A1 | 1/2018 | Tsai et al. |
| 2018/0067648 | A1 | 3/2018 | Lin et al. |
| 2018/0136851 | A1 | 5/2018 | Batra et al. |
| 2018/0136877 | A1 | 5/2018 | Ouyang et al. |
| 2018/0136878 | A1 | 5/2018 | Madpur et al. |
| 2018/0260347 | A1 | 9/2018 | Benisty |

OTHER PUBLICATIONS

PCT International Patent Application No. PCT/US2017/049744 International Search Report and Written Opinion dated Dec. 13, 2017.

U.S. Appl. No. 15/408,318 Non-Final Rejection dated Feb. 15, 2018.

U.S. Appl. No. 15/408,318 Notice of Allowance dated Jul. 11, 2018.

U.S. Appl. No. 15/402,180 Notice of Allowance dated Nov. 23, 2018.

U.S. Appl. No. 15/671,128 Non-Final Rejection dated Nov. 29, 2018.

Office Action dated Jun. 12, 2019 in U.S. Appl. No. 15/671,128.

* cited by examiner

INTERFACE FOR NON-VOLATILE MEMORY

CROSS-REFERENCES TO RELATED APPLICATIONS

This patent application claims priority to India Patent Application No. 201641038622 filed on Nov. 11, 2016 for Jiwang Lee et al., the entire contents of which are incorporated herein by reference for all purposes.

TECHNICAL FIELD

The present disclosure, in various embodiments, relates to non-volatile memory and more particularly relates to interfaces for accessing non-volatile memory.

BACKGROUND

As non-volatile memory technologies emerge, with higher speeds than previous non-volatile technologies, the interfaces and protocols associated with the previous non-volatile technologies may not be suited for the higher speed non-volatile memory technologies. Similarly, while volatile memory interfaces and protocols may be used for high speed data transfers using volatile memory, volatile memory interfaces and protocols may not be suited for the different latencies or the persistence of non-volatile memory technologies.

SUMMARY

Apparatuses are presented for accessing non-volatile memory. In one embodiment, an apparatus includes one or more memory die. In a certain embodiment, a memory die includes an array of non-volatile memory cells. In a further embodiment, a memory die includes a set of ports. In one embodiment, the set of ports includes a first port and a second port. In a certain embodiment, the first port includes a first plurality of electrical contacts and the second port includes a second plurality of electrical contacts. In one embodiment, a memory die includes an on-die controller that communicates via the set of ports to receive command and address information and to transfer data for a data operation on the array of non-volatile memory cells. In a certain embodiment, the on-die controller uses the first port and the second port in a first mode and uses the first port without the second port in a second mode. In a further embodiment, the second mode provides compatibility with an interface of a legacy type of memory die.

An apparatus, in another embodiment, includes an array of non-volatile memory cells on a memory die, and an on-die controller. In one embodiment, the on-die controller is configured to queue a plurality of commands, for data operations on the array of non-volatile memory cells, at an input stage of a command queue. In a certain embodiment, the on-die controller is configured to service a command from an output stage of the command queue in response to a series of clock pulses from a device controller. In a further embodiment, the on-die controller is configured to shift the output stage of the command queue to a subsequent command in response to a count of the clock pulses satisfying a threshold.

Systems are presented for accessing non-volatile memory. A system, in one embodiment, includes one or more memory die and a device controller. In a certain embodiment, a memory die includes an array of non-volatile memory cells. In a further embodiment, a memory die includes a set of ports. In one embodiment, the set of ports includes a first port and a second port. In a certain embodiment, the first port includes a first plurality of electrical contacts and the second port includes a second plurality of electrical contacts. In one embodiment, a memory die includes an on-die controller that queues a plurality of commands at an input stage of a command queue, services a command from an output stage of the command queue in response to a series of clock pulses from the device controller, and shifts the output stage of the command queue to a subsequent command in response to a count of the clock pulses satisfying a threshold. In one embodiment, the device controller communicates with the on-die controller for a selected die via the set of ports to send command and address information and to transfer data for a data operation on the selected die. In a certain embodiment, the device controller uses the first port and the second port in a first mode, and uses the first port without the second port in a second mode. In a further embodiment the second mode provides compatibility with an interface of a legacy type of memory die.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
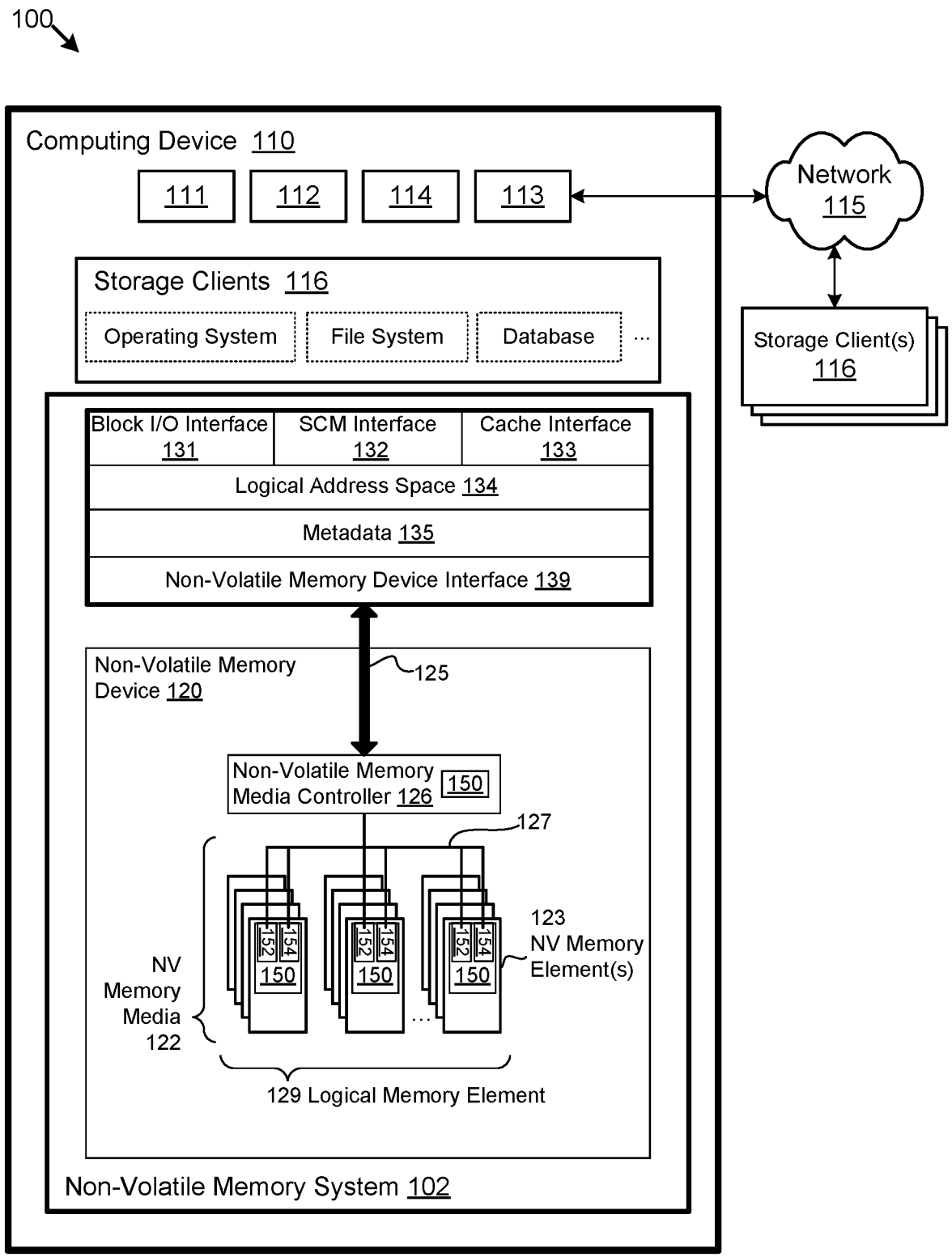
FIG. 1 is a schematic block diagram of one embodiment of a system comprising an interface component.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, resistive (e.g., resistive random access memory (ReRAM), memory resistor (Memristor) memory, programmable metallization cell memory, phase-change memory (PCM, PCME, PRAM, PCRAM, ovonic unified memory, chalcogenide RAM, or C-RAM), or the like), or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising an interface component 150 for a non-volatile memory device 120. The interface component 150 may be part of and/or in communication with a non-volatile memory media controller 126, a non-volatile memory element 123, a device driver, or the like. The interface component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, one or more portions of the interface component 150 may be embodied as one or more computer readable instructions stored on the non-transitory storage medium 114.

The non-volatile memory system 102, in the depicted embodiment, includes an interface component 150. The interface component 150, in one embodiment, is configured to transmit and receive data for data operations for the non-volatile memory device 120 and/or for one or more non-volatile memory elements 123. For example, the interface component 150 may comprise hardware of the non-volatile memory media controller, hardware of one or more non-volatile memory elements 123, or the like. In one embodiment, the interface component 150 may comprise a first port 152 with a first plurality of electrical contacts for a non-volatile memory device 120 and/or element 123 and a second port 154 with a second plurality of electrical contacts for the non-volatile memory device 120 and/or element 123. The interface component 150 may support multiple access modes, such as a first mode (e.g., a burst mode) which may provide a full speed and/or access to one or more unique features of the non-volatile memory media 122, a second mode (e.g., a legacy mode or compatibility mode) which may provide support for a different access protocol (e.g., an older access protocol, emulating a different type of memory media 122 such as NAND flash, or the like. For example, in one embodiment, the non-volatile memory media 122 may comprise a resistive memory medium such as ReRAM, Memristor memory, programmable metallization cell memory, phase-change memory (PCM, PCME, PRAM, PCRAM, ovonic unified memory, chalcogenide RAM, or C-RAM), or the like and the interface component 150 may provide two access modes, one mode comprising a legacy or compatibility mode which emulates a NAND flash access protocol (e.g., a NAND flash toggle mode), or the like, for clients 116 configured to use a legacy access protocol.

In a first mode (e.g., a burst mode, a native mode, or the like) the first port 152 may receive command and/or address information for data operations on the non-volatile memory device 120 and/or element 123, while the second port 154 transmits data of the data operations (e.g., receiving data from a client 116 for a write request, sending data to a client 116 for a read request, or the like). In a second mode (e.g., a legacy mode, a compatibility mode, or the like) the first port 152 may both receive command and address information for data operations and transmit data for the operations (e.g., so that the second port 154 isn't used in the second mode). The interface component 150 may comprise a command queue that stores multiple commands to be executed on one or more non-volatile memory elements 123, even if the commands are in different modes.

In certain embodiments, the interface component 150 may latch and/or clock command and address information for commands for one or more non-volatile memory elements 123 (e.g., integrated circuit chips, packages, die, die planes, or other discrete units of non-volatile memory media 122) according to a first clock/strobe signal received on one or more command and address strobe lines. The interface component 150 may latch and/or clock data for commands for one or more non-volatile memory elements 123 according to a second clock signal received on one or more data strobe lines.

In this manner, in certain embodiments, the interface component 150 may operate with no free running clock between the non-volatile memory media controller 126 and a non-volatile memory element 123, relying instead on one or more command and address strobe signals and/or one or more data strobe signals. As described in greater detail below, in one embodiment, a free running clock comprises an alternating timing signal transmitted (e.g., from a controller 126 to a non-volatile memory element 123, or the like) with little or no interruption, throughout multiple commands, to provide timing for the multiple commands and/or other operations. In certain embodiments, a free running clock may be substantially constant and/or continuous while a controller 126 is in a powered on state. The interface component 150, in one embodiment, may time the sensing of a command and address strobe and/or a data strobe based on a transition in a clock enable signal, avoiding the use of a free running clock. A strobe and/or strobe signal, as used herein, comprises a temporary timing signal transmitted (e.g., from a controller 126 to a non-volatile memory element 123, or the like) for a single command and/or operation or less (e.g., for a portion of a command and/or operation).

In one embodiment, the interface component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the interface component 150 may comprise executable software code, such as a device driver or the like, stored on the computer readable storage medium 114 for execution on the processor 111. In a further embodiment, the interface component 150 may include a combination of both executable software code and logic hardware.

In one embodiment, the interface component 150 is configured to receive storage requests from a device driver or other executable application via a bus 125 or the like. The interface component 150 may be further configured to transfer data to/from a device driver and/or storage clients 116 via the bus 125. Accordingly, the interface component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the interface component 150 may receive storage requests as an API call from a storage client 116, as an IO-CTL command, or the like.

According to various embodiments, a non-volatile memory controller 126 in communication with one or more interface components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 2:
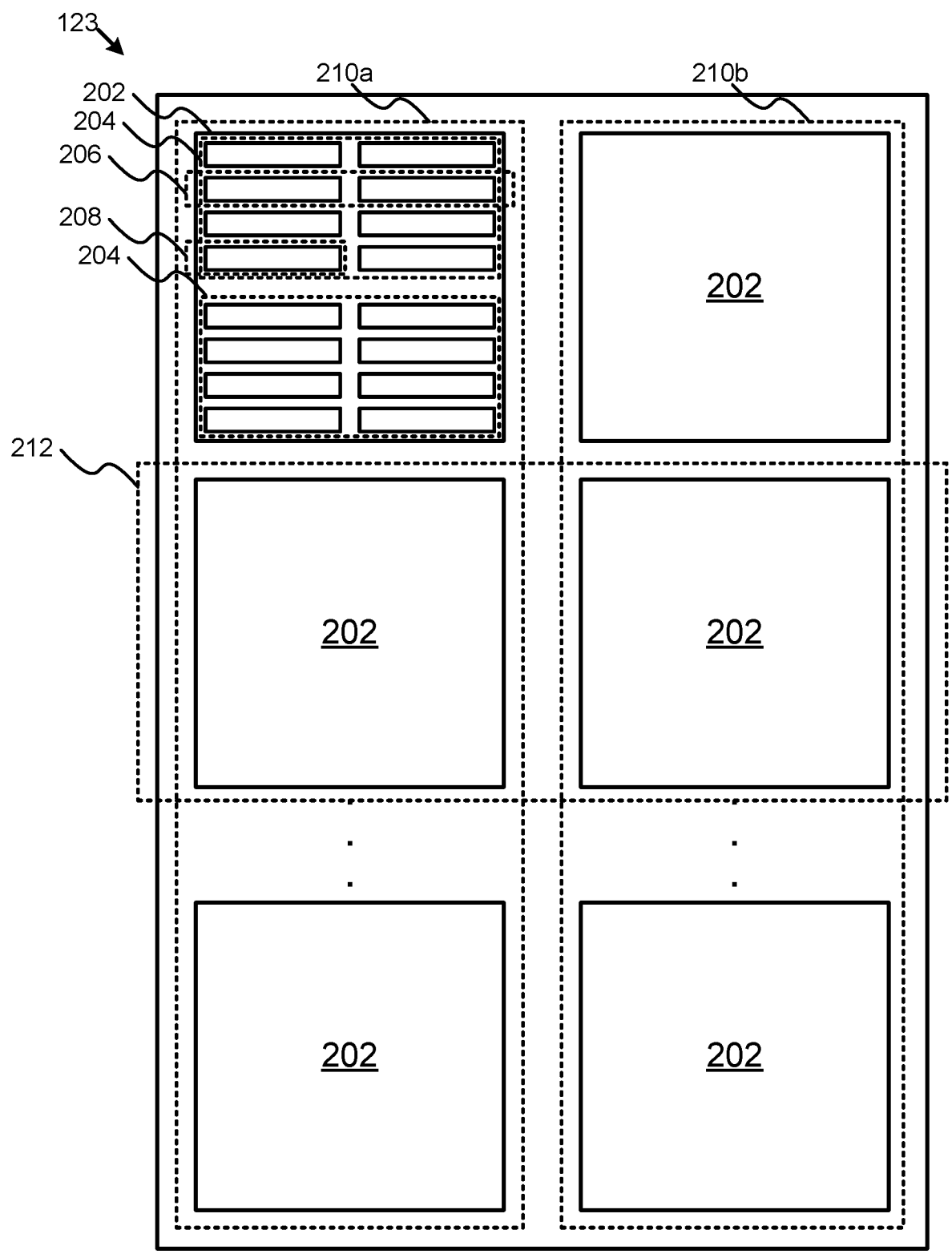
FIG. 2 is a schematic block diagram illustrating one embodiment of a non-volatile memory element.

FIG. 2 depicts one embodiment of a non-volatile memory element 123. In the depicted embodiment, the non-volatile memory element 123 comprises a package with multiple die 202 or cores 202 (e.g., 2 die, 4 die, 6 die, 8 die, 10 die, 12 die, 14 die, 16 die, 32 die, 64 die, or another number of die 202 or cores 202). Each die 202 or core 202 comprises a semiconductor device of non-volatile memory. A die 202 or core 202 may be divided into multiple bank groups 204 each with multiple banks 206 of non-volatile memory (e.g., 2 bank groups 204 of 4 banks 206 each, in the depicted embodiment). Each bank 206, in the depicted embodiment, comprises two sub-arrays 208 of non-volatile memory cells, which may be arranged into pages or the like. The die 202 or cores 202, in one embodiment, are divided into two or more channels 210a, b. Corresponding die 202 in the channels 210a, b may comprise a rank 212 of die 202. For example, in an embodiment where there are eight die 202 per channel 210a, b, there may be eight ranks, 0-7 per non-volatile memory element 123.

In one example embodiment, each sub-array 208 may comprise 32,768,000 8 Byte pages (e.g., for a 64 Gigabyte device) with 256 Megabytes per sub-array 208, may comprise 65,536,000 8 Byte pages (e.g., for a 128 Gigabyte device) with 512 Megabytes per sub-array 208, or the like. The two or more sub-arrays 208 per bank 206 may be independently addressable. A memory write, in one embodiment, is committed with a bank group 204 of four banks 206 and eight sub-arrays 208 per bank group 204 to support multiple concurrent independently addressable write transactions per die 202. For example, using write grouping on a memory die 202, one pending write transaction may be queued per sub-array 208 in an input register.

A write of queued data may be performed concurrently for sub-arrays 208 in a bank group 204, or the like. A read of data, in certain embodiments, may be performed independently for each bank 206 (e.g., 2 sub-arrays 208). In one embodiment, two read modes may be supported, such as a low latency read from a single sub-array 208 in a bank 206 and a high bandwidth group read from two sub-arrays 208 in a bank 206. For a group read, read grouping may be done in the controller 126 that may send addresses of group reads consecutively and may receive read data consecutively. The die 202 may support write suspend by read.

The die 202, in one embodiment, support extended time for writes which have bit errors after initial write cycles complete. Writes requiring additional time, for example, may be captured on the die 202 on a write bank group 204 sub-array 208 basis. An extended write buffer flush command may indicate when data in one or more extended write buffers is to be rewritten to memory sub-arrays 208, or the like.

Figure 3:
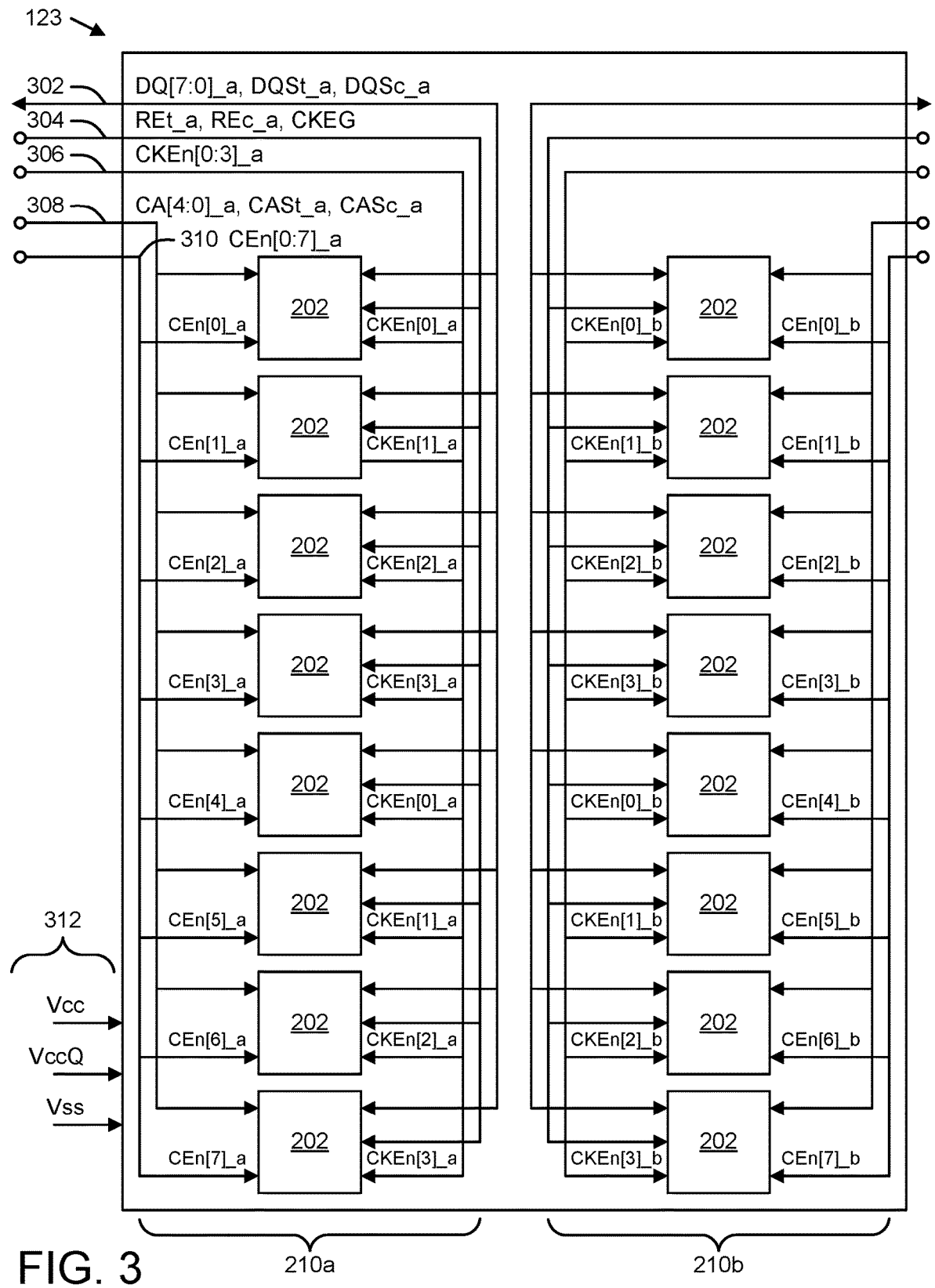
FIG. 3 is a schematic block diagram illustrating a further embodiment of a non-volatile memory element.

FIG. 3 depicts one embodiment of a non-volatile memory element 123. In the depicted embodiment, the non-volatile memory element 123 (e.g., a package or the like) comprises two channels 210a, b of multiple die 202 each. The die 202, in the depicted embodiment, are electrically connected to one or more data lines 302 (e.g., a data strobe line DQSt, a data strobe complement line DQSc, a bidirectional data bus DQ, or the like), one or more enable lines 304 (e.g., a read enable line REt, a read enable complement line REc, a rank group clock enable line CKEG, or the like), one or more clock enable lines 306 (e.g., a clock enable line CKEn, or the like), one or more command and address lines 308 (e.g., a command and address bus CA, a command and address strobe true line CASt, a command and address strobe complement line CASc, or the like), one or more chip enable lines 310 (e.g., a chip enable line CEn), or the like. For example, the non-volatile memory element 123 may comprise a plurality of electrical connections (e.g., pads, pins, solder balls, traces, ports, wires, or other conductors) in electrical communication with a controller 126 to conduct electrical signals from the controller 126 to the die 202 within the non-volatile memory element 123. In certain embodiments, to preserve electrical connections and/or for efficiency, the same electrical contacts or lines 302, 304, 306, 308, 310 may be used for different types of signals in different modes, different operations, and/or different states of the non-volatile memory element 123.

In one embodiment, a device controller 126 uses the chip enable line CEn 310 to select a target die 202 for a command and address bus CA 308. For example, when the chip enable signal CEn 310 is low, a target die 202 may be selected for receiving command and address information. When the chip enable signal CEn 310 goes high, in one embodiment, die 202 receivers can enter a reduced power state (e.g., subject to a predefined wakeup time or the like) and the associated read or write operation may continue in the die 202 core until completion, or the like. In the depicted embodiment, the chip enable line CEn 310 is an eight-bit line, so that the first bit of the chip enable line CEn 310 enables or disables a first die 202 for receiving command and address information, the second bit of the chip enable line CEn 310 enables or disables a second die 202 for receiving command and address information, and so on.

A device controller 126, in certain embodiments, uses the clock enable line CKEn 306 to select a target die 202 for the data bus DQ 302. For example, when the clock enable line CKEn 306 is low, the target die 202 may be selected for transferring data for a read or write operation. In one embodiment, when the clock enable line CKEn 306 goes high, the read enable RE signal 304 and/or the data strobe line DQS signal 302 cannot be recognized by the target die 202 and the read or write operation continues in the die 202 core until completion, or the like.

In embodiments with multiple ranks, the rank group clock enable line CKEG 304, when low, may cause the clock enable signals 306 to apply to a first set of die 202 ranks (e.g., ranks 0, 1, 2, and 3 or the like). When high, the rank group clock enable line CKEG 304 may cause the clock enable signals 306 to apply to a second set of die 202 ranks (e.g., ranks 4, 5, 6, and 7 or the like). For example, in the depicted embodiment, the clock enable line CKEn 306 is a four bit line so that the first bit of the clock enable line CKEn 306 enables or disables a die 202 of rank 0 or rank 4 for transferring data, the second bit of the clock enable line CKEn 306 enables or disables a die 202 of rank 1 or rank 5 for transferring data, and so on, and the rank group clock enable line CKEG 304 identifies whether the clock enable signals 306 apply to the lower-rank or higher-rank dies 202.

The one or more command and address strobe lines CAS 308, in certain embodiments, may comprise a command and address strobe true line CASt 308 and/or a command and address strobe complement line CASc 308. The command and address strobe line CAS 308 (e.g., a CASt line 308) may control latching of commands and/or addresses on the command and address bus CA 308, with, in one embodiment, command and/or address latching on rising and/or falling edge of strobes of the signal 308 (e.g., double data rate (DDR) signaling). A command and address strobe complement line CASc 308, in certain embodiments, is a complementary signal to the command and address strobe true line CASt 308, with the opposite value, to improve the robustness of the signaling on the physical channel, or the like.

The command and address bus CA 308, in one embodiment, transfers command and/or address information to a non-volatile memory element 123 and/or a die 202. The command and address bus CA 308 may comprise a multibit bus (e.g., 5 bit or the like). In one embodiment, the command and address bus CA 308 is a unidirectional bus.

In certain embodiments, the one or more read enable lines RE 304 enable serial data output from a targeted die 202. The one or more read enable lines RE 304, in one embodiment, comprise a read enable true line REt 304 and its complementary signal (e.g., with an opposite value), a read enable complement line REc 304, which may improve the robustness of the signaling on the physical channel, or the like.

In one embodiment, the one or more data strobe lines DQS 302 define and/or indicate a data value window for either outputting read data or inputting write data on the bidirectional data bus DQ 302. DDR signaling, or the like, in certain embodiments, may be used for data, with read data being edge-aligned, write data being centered, or the like. The one or more data strobe lines DQS 302, in one embodiment, comprises a data strobe true line DQSt 302 and its complementary signal, a data strobe complement line DQSc 302, with an opposite value, to improve the robustness of the signaling on the physical channel, or the like.

In certain embodiments, there is not a free running clock between the controller 126 and the non-volatile memory element 123, but commands, addresses, and data are instead latched or strobed in, or out, using the strobe signals DQS 302 and CAS 308 described above. In one embodiment, a free running clock may comprise an alternating timing signal transmitted (e.g., from a controller 126 to a non-volatile memory element 123, or the like) with little or no interruption, throughout multiple commands, to provide timing for the multiple commands and/or other operations. In certain embodiments, a free running clock may be substantially constant and/or continuous while a controller 126 is in a powered on state. The non-volatile memory die 202, in one embodiment, may time the sensing of a command and address strobe and/or a data strobe based on a transition in a temporary clock enable signal, avoiding the use of a free running clock. A strobe and/or strobe signal, as used herein, comprises a temporary timing signal transmitted (e.g., from a controller 126 to a non-volatile memory element 123, or the like) for a single command and/or operation or less (e.g., for a portion of a command and/or operation).

For example, in one embodiment, the non-volatile memory media 122 of the chips 202 may have a higher latency than volatile memory such as DRAM or the like. Running a clock constantly, while waiting for an operation to complete, may unnecessarily consume power, especially at high frequencies. Synchronizing operation of the non-volatile memory element 123 with an external clock, in certain embodiments, may also unnecessarily increase the complexity of the design.

In the depicted embodiment, the different channels 210a, 210b have substantially independent signals 302, 304, 306, 308, 310. In certain embodiments, one or more of the signals 302, 304, 306, 308, 310 may be tied together in common for the two channels 210a, 210b, such as a CKEG rank group clock enable 304, which enables die 202 of the same rank in both channels 210a, 210b. The non-volatile memory element 123, in the depicted embodiment, also includes a plurality of power and/or ground inputs 312, which the non-volatile memory element 123 may internally distribute to the die 202 and/or other electrical components.

Figure 4A:
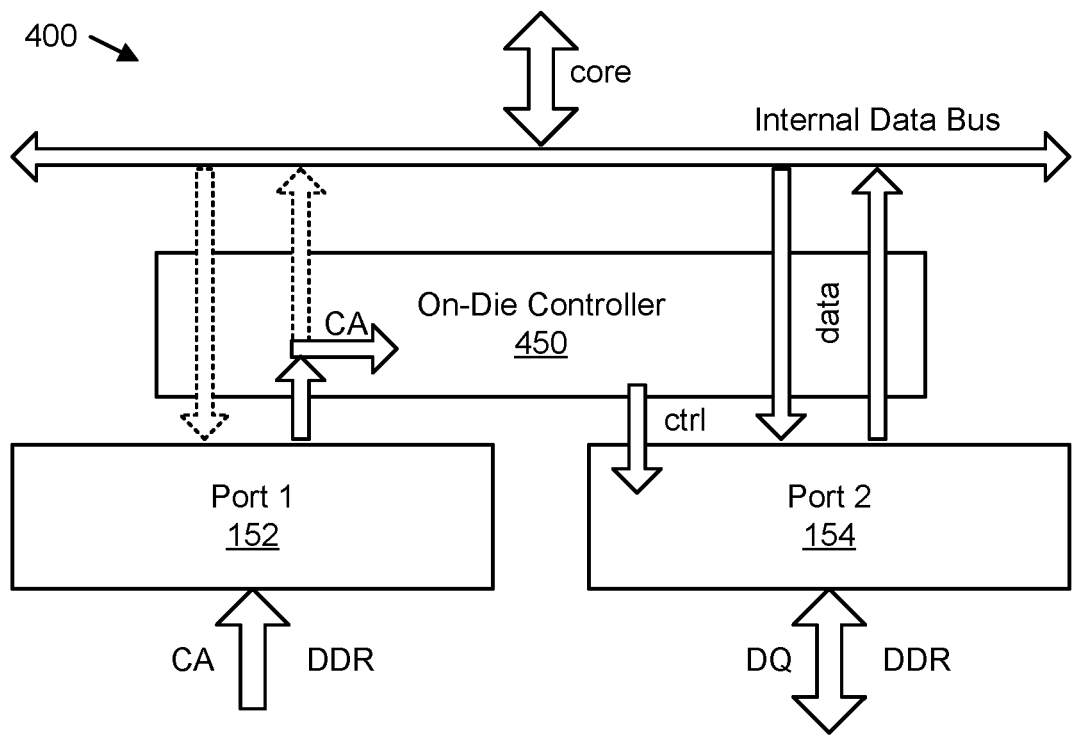
FIG. 4A is a schematic block diagram illustrating one embodiment of peripheral components for a memory die.
Figure 4B:
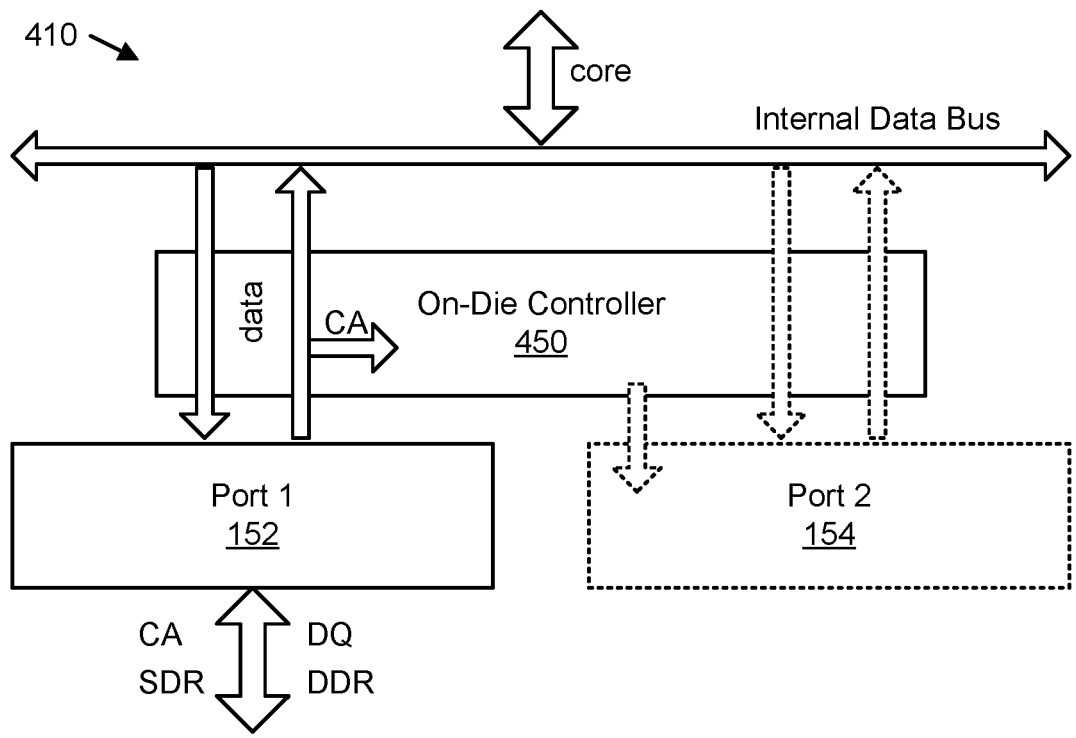
FIG. 4B is a schematic block diagram illustrating a further embodiment of peripheral components for a memory die.

FIGS. 4A and 4B depict embodiments of peripheral components 400, 410 for a memory die 202. As described above with regard to FIG. 2, in certain embodiments, a die 202 may be a semiconductor device of non-volatile memory. In the depicted embodiments, a die 202 includes an array of non-volatile memory cells referred to as a core, and peripheral components 400, 410 that communicate with the core to perform data operations such as reading, writing, erasing, and the like. In certain embodiments, a "cell" may refer to a smallest or fundamental physical unit of memory, or storage, for a die 202, and may be referred to interchangeably as a "storage cell" a "memory cell" or the like. For example, a cell may be a floating gate transistor for NAND flash memory, a memristor for resistive memory, or the like. Thus, in a further embodiment, an array of cells may be a two-dimensional grid, a three-dimensional block, a group, or other similar set of cells where data can be physically stored, for short-term memory use, long-term storage use, or the like. In certain embodiments, peripheral components 400, 410 include components of a die 202 other than the core array of cells. In the depicted embodiments, the peripheral components 400, 410 include a set of ports, including a first port 152 and a second port 154, and an on-die controller 450.

A die 202, in various embodiments, may refer to an integrated circuit that includes both a core array of non-volatile memory cells and peripheral components 400, 410 for communicating with the core. In one embodiment, such an integrated circuit may be a three-dimensional integrated circuit that includes multiple die planes and/or layers, but may still be referred to as a die 202. In certain embodiments, a die 202 may include more than one core arrays of non-volatile memory cells. For example, a multi-core die 202 may write data to one core while reading from another core. However, in other embodiments, a die 202 may include a single core array of non-volatile memory cells. As described with regard to FIGS. 1-3, a non-volatile memory device 120 or non-volatile memory element 123 may include one or more dies 202.

The set of ports, in the depicted embodiment, includes a first port 152 and a second port 154, which may be substantially as described above with regard to FIG. 1. Each port 152, 154 includes a plurality of electrical contacts, so that the first port 152 includes a first plurality of electrical contacts and the second port 154 includes a second plurality of electrical contacts. The specific electrical contacts for each port 152, 154 are described in further detail below with regard to FIGS. 5A and 5B.

In various embodiments, an electrical contact for a die 202 may refer to a pad, lead, wire, or the like that is configured to communicate an electrical signal or value between the die 202 and an external component such as a device controller (e.g., non-volatile memory media controller 126). In further embodiments, a port may refer to a set, grouping, or collection of one or more electrical contacts. In certain embodiments, a port may refer to a group of electrical contacts that are physically separated from other contacts. For example, in one embodiment, the electrical contacts for the first port 152 may be physically separated from the electrical contacts for the second port 154. As a further embodiment, a first port 152 may include a first row or array of input/output (I/O) pads for a die 202, and the second port 154 may include a second row or array of I/O pads for a die 202, separated by a region that does not include I/O pads. In another embodiment, a port may refer to a logical grouping of electrical contacts, regardless of whether the contacts are physically separated from contacts of other ports. For example, contacts for a second port 154 may be interleaved between contacts for a first port 152. Various ways of arranging electrical contacts and of grouping electrical contacts into ports 152, 154 will be clear in view of this disclosure.

The on-die controller 450, in one embodiment, communicates via the set of ports to receive command and address information and to transfer data for data operations on the core array of memory cells. In various embodiments, an on-die controller 450 may refer to a component, control/operation logic, a set of components, or the like on a die 202, that receives command and/or address information, transfers data via a set of ports, communicates data between a set of ports and a core array of memory cells, and/or performs data operations using communicated data. Communicating via the set of ports may include any form of sending or receiving information via the electrical contacts of the first port 152 and/or the second port 154.

Command and address information may include commands, such as read commands, write commands, program commands, erase commands, status query commands, and any other commands supported by a die 202, and addresses corresponding to the commands, such as an address to write data to, and address to read data from, or the like. The on-die controller 450 may receive command and address information from a device controller, such as the non-volatile memory media controller 126. For example, the device controller may send command and address information using the command and address lines 308, including the command and address bus CA, command and address strobe true line CASt, and command and address strobe complement line CASc.

Data operations may include read, write, program, or erase operations, or the like, and data for the data operations may include data to be written to the core array of memory cells, data to be read from the core array of memory cells, or the like. Thus, in certain embodiments, transferring data for a data operation may include transferring write data to the core array of memory cells, transferring read data from the core array of memory cells, or the like. Transferring data may include sending data, receiving data, making data available to a device controller on latches, or the like. In one embodiment, the on-die controller 450 may transfer data for data operations between the core array of memory cells and a device controller, such as the non-volatile memory media controller 126. For example, for a write operation, the on-die controller 450 may receive the data to be written from the device controller. Similarly, for a read operation, the on-die controller 450 may send the read data to the device controller. In certain embodiments, the data lines 302, including the bidirectional data bus DQ, data strobe true line DQSt, and data strobe complement line DQSc may be used by the on-die controller 450 and/or the device controller to transfer data for a data operation.

FIG. 4A depicts one embodiment of the peripheral components 400, in a first mode. In the first mode, the on-die controller 450 uses both the first port 152 and the second port 154. In certain embodiments, the first mode provides a storage class memory interface, in which the on-die controller 450 receives the command and address information for a data operation via the first port 152, and transfers the data for the data operation via the second port 154.

In general, in various embodiments, a storage class memory may refer to a non-volatile memory that combines the capability for long-term, non-volatile data storage (typical of traditional storage devices) with fast, byte-level access (typical of traditional DRAM volatile memory). Latency of storage class memory may still be greater than for DRAM in certain embodiments, but may be substantially less than latency for traditional NAND flash storage devices. For example, in one embodiment, latency for a NAND flash storage device may be measured in tens of microseconds, while latency for DRAM may be measured in tens of nanoseconds, and latency for storage class memory may be measured in hundreds of nanoseconds. In general, in various embodiments, storage class memory may be significantly more storage dense than DRAM, but significantly faster than traditional storage devices. In certain embodiments, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

In further embodiments, a storage class memory interface may refer to any interface for storage class memory that provides access to storage class memory features not typical of legacy or traditional non-volatile memory devices. For example, a storage class memory interface may provide full-speed access to storage class memory at a byte-level granularity, in four-byte bursts, eight-byte bursts, or the like. (By contrast, a traditional block I/O interface for non-volatile storage may provide lower-speed access at a page or block-level granularity.)

In the depicted embodiment, the first mode, provided by the peripheral components 400, is a burst mode (e.g., a ReRAM burst mode), with random access (e.g., byte addressable) read and/or write operations of fixed burst lengths. For example, in a burst mode, a non-volatile memory die 202 may receive an address (e.g., at a byte granularity) in association with a read and/or write command, and may execute the command for the received address and a predefined number of additional addresses (e.g., of the fixed burst length), in sequence after the received address, reading and/or writing data of the command for the entire sequence (e.g., an 8 byte, 16 byte, 24 byte, 32 byte, 48 byte, 64 byte, and/or 128 byte fixed burst length, or the like).

In the first mode, both a first port 152 and a second port 154 may be used by the on-die controller 450. In the first mode, in the depicted embodiment, electrical contacts of the first port 152 receive command and address information for a data operation on a non-volatile memory element 123. Electrical contacts of the second port 154, in the depicted embodiment of the first mode, transmit data of the data operation (e.g., receive data for a write/program operation, send data for a read operation, or the like). In certain embodiments, while in the first mode, the first port 152 is used for command and address information only (e.g., a command and address bus CA 308, one or more command and address strobe signals CAS 308, or the like) and the second port 154 is used for data only (e.g., a data bus DQ 302, one or more data strobe signals DQS 302, one or more read enable signals RE 304, or the like), allowing two separate sets of I/Os, one on each port 152, 154.

In the depicted embodiment, in the first mode the command and address bus CA and the data bus DQ are both double data rate buses. Command and address information is received via the command and address bus CA at the first port 152. The command and address information goes to the on-die controller 450, which controls the second port 154 and the transfer of data between the core and the second port 154 (via the internal data bus). The on-die controller 450 receives data for a write command, or sends data for a read command, via the second port 154.

In various embodiments, using a first port 152 to receive command and address information and a second port 154 to transfer data may allow the on-die controller 450 to receive command and address information and transfer data simultaneously. For example, command and address information for a later command may be received while data is transferred for an earlier command. In certain embodiments, as commands and addresses are received using the first port 152, a command queue for the on-die controller 450 stores the commands and addresses while the die 202 sequentially executes the commands (e.g., in the order received on the first port 152) and the data for each operation is transmitted successively using the second port 154 (e.g., in the order the commands were received on the first port 152), allowing the controller 126 to queue several commands at once for back to back execution, overlapping execution, parallel execution, or the like.

FIG. 4B depicts one embodiment of the peripheral components 410, in a second mode. In the second mode, the on-die controller 450 uses the first port 152 without the second port 154. In certain embodiments, the second mode provides compatibility with an interface of a legacy type of memory die. In general, in various embodiments, a legacy type of memory die may refer to an older type of memory die than the die 202. For example, the die 202 may include storage class memory, and a legacy type of memory die may include a different type of non-volatile memory medium and/or non-volatile storage medium, such as (for example) NAND flash. In another embodiment, a legacy type of memory die may use an older protocol than the storage class interface for the die 202, such as an Open NAND Flash Interface (ONFI) protocol, a toggle mode or double data rate (DDR) protocol, a Common Flash Memory Interface (CFI), or the like. The on-die controller 450, in the second mode, may provide compatibility with legacy memory die, by emulating the legacy memory medium, emulating the legacy protocol, or the like. In certain embodiments, using two modes and providing backward compatibility with legacy memory die in the second mode may allow clients to access the full feature set of storage class memory in the first mode, and may allow older clients to use storage class memory as if it were an older type of memory or storage in the second mode.

In certain embodiments, the second mode provides a NAND storage interface, in which the on-die controller 450 both receives the command and address information and transfers the data via the first port 152. In various embodiments, a NAND storage interface may refer to any interface for accessing NAND flash storage, such as an Open NAND Flash Interface (ONFI) interface, a toggle mode NAND interface, a Common Flash Memory Interface (CFI), or the like. In certain embodiments, a NAND storage interface may provide page or block-level, rather than byte-level access to storage or memory cells. In some embodiments, a NAND storage interface may emulate aspects of NAND flash storage, such as page-level programming and block-level erasing, even when the underlying memory for the core array of memory cells is storage class memory.

In the second mode (e.g., a legacy mode, a compatibility mode, a NAND toggle mode, or the like), the second port 154 is not used, and only the first port 152 is used. In the depicted embodiment, the first port 152 is used for both receiving command and address information for a data operation and transmitting data of the data operation (e.g., receiving data for a write/program operation, sending data of a read operation, or the like). In the depicted embodiment, in the second mode, the data bus DQ is a double data rate bus, as in the first mode, but the command and address bus CA is a single data rate bus. Command and address information is received via the command and address bus CA at the first port 152. The command and address information goes to the on-die controller 450, which controls data transfer between the core and the first port 152 (via the internal data bus). The second port 154 is inactive in the second mode. Using the first port 152 for command and address information and data may prevent command and address information from being transferred at the same time as data for data operations, but may provide backwards compatibility with legacy NAND devices or other types of legacy storage.

Thus, in various embodiments, both the first port 152 and the second port 154 are used for data operations in a first mode, but the first port 152 is used without the second port 154 for data operations in the second mode. The peripheral components 400, 410, in certain embodiments, may dynamically transition from a first mode to a second mode based on a command received, a protocol used, or the like, even for successively received commands, which may be adjacent in a command queue or the like.

Figure 5A:
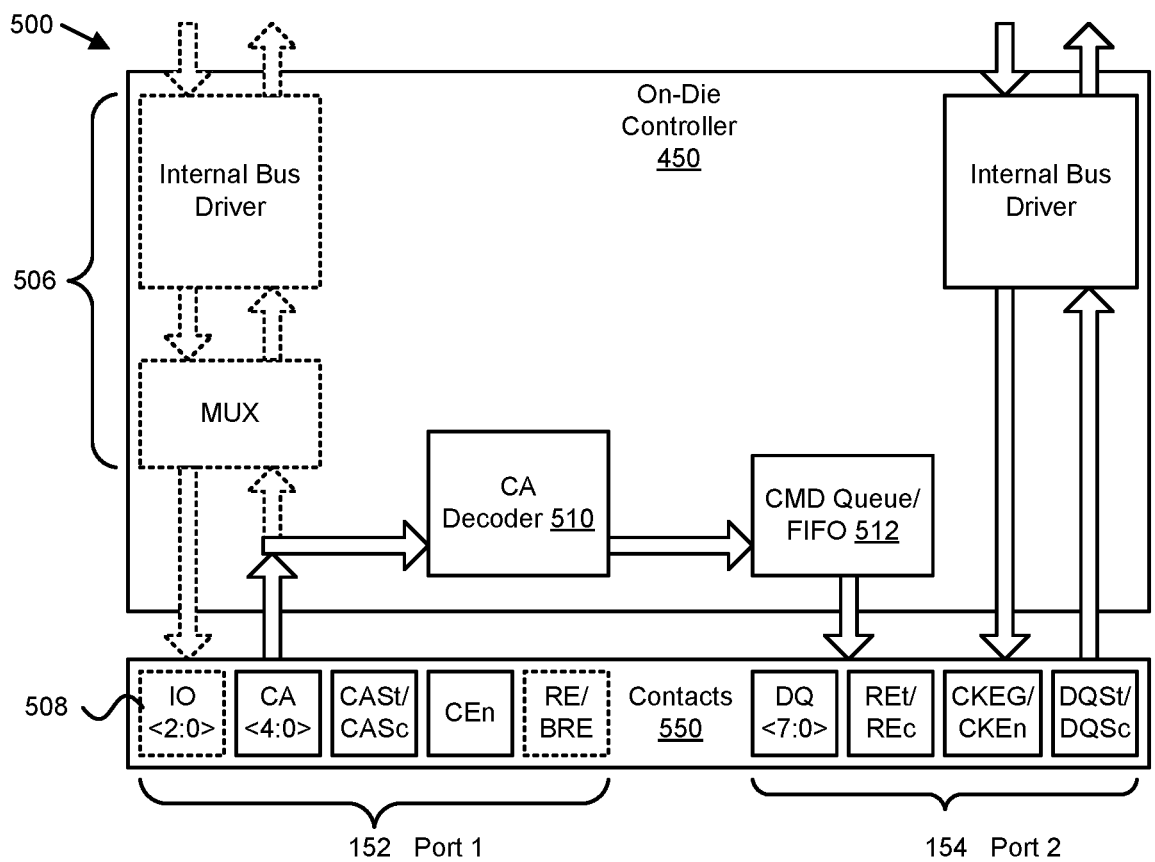
FIG. 5A is a schematic block diagram illustrating one embodiment of peripheral components for a memory die.
Figure 5B:
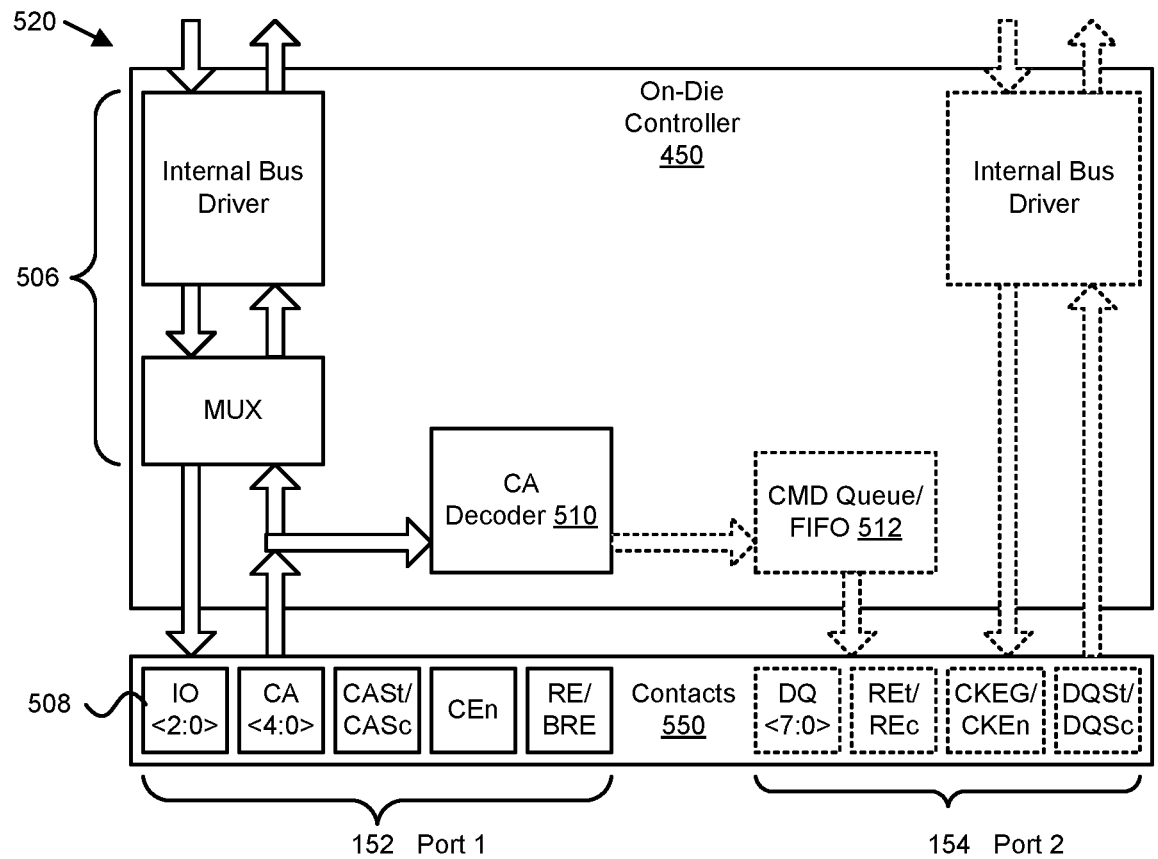
FIG. 5B is a schematic block diagram illustrating a further embodiment of peripheral components for a memory die.

FIGS. 5A and 5B depict embodiments of peripheral components 500, 520 for a memory die 202, including an on-die controller 450, and contacts 550, grouped into a first port 152 and a second port 154, as described above. In the depicted embodiment, the contacts 550 for the first port 152 include five contacts 550 for the five-bit control and address bus CA, latches for incoming command and address information (or for data in a legacy or compatibility mode), and contacts 550 for true and complementary command and address strobe signals CASt and CASc. Three additional contacts 550 are provided for I/O lines 508, to provide eight bit wide data transfer in a legacy or compatibility mode. One contact 550 is provided for receiving a chip enable signal CEn. (The package described with regard to FIG. 3 includes an eight bit chip enable line for eight dies 202, and a single die 202 may be enabled or disabled for receiving command/address information by one bit).

In the depicted embodiment, the contacts 550 for the second port 154 include eight contacts 550 for the eight-bit bidirectional data bus DQ, latches for data, and contacts 550 for true and complementary data strobe signals DQSt and DQSc. The contacts 550 also include contacts 550 for true and complementary signals for a read enable clock RE. Lastly, contacts 550 are provided for receiving a clock enable signal CKEn and a rank group clock enable signal CKEG. (The package described with regard to FIG. 3 includes a four bit clock enable line, and a one bit rank group clock enable line CKEG for eight dies 202, so that a single die 202 may be activated or deactivated for data transfer with one clock enable bit and the rank group clock enable line). In the depicted embodiment, the on-die controller 450 includes muxing components 506, such as multiplexers (MUX) and internal data bus drivers, a command and address decoder 510, and a command queue 512.

FIG. 5A depicts one embodiment of peripheral components 500 for a non-volatile memory die 202 in a first mode (e.g., a burst mode, a ReRAM burst mode, or the like). In the depicted embodiment, both a first port 152 and a second port 154 are used in the first mode, the first port 152 for command and address information for commands and the second port 154 for transmitting data of the commands. As indicated by dotted outlines, certain muxing components 506 and I/O lines 508 of the first port 152 are not used in the first mode. For example, the I/O lines 508 may be used to provide eight-bit data transmissions via the first port 152 in the second mode, but may be unused, disabled, or deactivated in the first mode. Additionally, the muxing components 506 may provide one or more legacy functions, may assist in switching between modes, or the like. Using separate data paths in the first mode, in certain embodiments, may lower read latency, remove extra muxing logic 506, or the like (e.g., since sharing a single data path for command and address information and data of a command may require more muxing of data, clock, signals, or the like).

FIG. 5B depicts one embodiment of peripheral components 520 for a non-volatile memory die 202 in a second mode (e.g., a legacy mode, a compatibility mode, a NAND toggle mode, or the like). In the depicted embodiment, only a first port 152 is used in the second mode, for both command and address information for commands and for transmitting data of the commands. The muxing components 506 and I/O lines 508 of the first port 152, in the depicted embodiment, are used in the second mode. The second port 154, however, is not used in the second mode, as indicated by dotted outlines.

A command queue 512 (e.g., a first-in-first-out (FIFO) queue of commands), in certain embodiments, may be used to determine which mode is associated with a next command, and whether to enable the second port 154. For example, multiple commands (e.g., in a first mode, in a second mode, in a mixture of both modes) may be issued on the first port 152, and stored in the command queue 512, before data is transmitted (e.g., toggled) on the second port 154. In certain embodiments, the command queue 512 may comprise a separate read queue and write queue, with pointers that move through the commands in the queues (e.g., moving to a next command at the end of a burst or series of clock pulses, at the end of a command, at the end of a predetermined number of cycles, or the like).

In the depicted embodiments of FIGS. 5A and 5B, the on-die controller 450 may use at least set of contacts 550 of the set of ports 152, 154 for single ended input/output, and may use at least one pair of contacts 550 of the set of ports 152, 154, for a differential strobe. Single-ended input/output, in various embodiments, may refer to inputs or outputs that share a common voltage reference (e.g., ground and/or another reference voltage). For example, the five-bit command and address bus CA and/or the eight bit data bus DQ may be single ended buses, so that a set of five contacts 550 for a five bit bus or a set of eight contacts 550 for an eight-bit bus carries five or eight voltages, respectively, and uses a common voltage reference. In certain embodiments, a voltage reference for command and address bus CA may be different from a voltage reference for data bus DQ.

In certain embodiments, a differential strobe may refer to a clock, strobe, or other timing signal that is carried using a pair of contacts 550 for true and complementary signals. For example, in some embodiments, one contact 550 may carry the true command and address strobe CASt, and a second contact 550 may carry a complementary (e.g., opposite) signal CASc. (The data strobe DQS, and/or read enable clock RE may similarly be differential strobes with true and complementary signals DQSt/DQSc and REt/REc, respectively). In certain embodiments, a difference between the true and complementary signals may provide a strobe that oscillates with a larger amplitude than either signal individually. Additionally, noise in one signal may be distinguished from a legitimate rising or falling edge based on whether it is reflected in the other signal. Thus, using a pair of contacts 550 for a differential strobe may improve the robustness of the signaling on the physical channel.

In general, in various embodiments, the strobe signals marshal the transmission of command and address information and data. In one embodiment, the on-die controller 450 receives the command and address information over the command and address bus CA, according to a command and address strobe signal CAS. The command and address strobe signal may be received via one or more command and address strobe lines of the set of ports (e.g., a single contact 550 for a single-ended CAS strobe, a pair of contacts 550 for a differential CASt/c strobe, or the like). The command and address strobe signal may be sent by a device controller, such as the non-volatile memory media controller 126, to control latching of commands and/or addresses. For example, in the first mode (e.g., burst mode), a command may be sent in a burst of four CAS clock cycles (or eight transfers, using double data rate signaling).

In a further embodiment, the on-die controller 450 transfers data for a data operation according to a data strobe signal DQS. The data strobe signal may be received via one or more data strobe lines of the set of ports (e.g., a single contact 550 for a single-ended DQS strobe, a pair of contacts for a differential DQSt/c strobe, or the like). For a write operation, the data strobe signal may be sent by a device controller, such as the non-volatile memory media controller 126, to marshal the data to be written, as it is sent from the device controller. For example, 64 bits of data to be written may be sent over an eight bit bidirectional data bus DQ in a burst or series of four DQS clock cycles (or eight transfers, using double data rate signaling). For a read operation, the data strobe signal DQS may be sent by the on-die controller 450 to the device controller, to marshal the transfer of data as it is sent to the device controller. In a certain embodiment, the data strobe signal DQS for a read may be sent by the on-die controller 450 based on a read enable clock signal RE sent by the device controller.

In a certain embodiment, the command and address strobe signal CAS may be independent from the data strobe signal DQS. Independent signals may be independently generated (e.g., by separate oscillators, or the like), instead of being based on each other or on a common global clock. In certain embodiments, distribution of a global (or other non-local) clock signal may consume a significant amount of power. By contrast, using independent CAS and DQS strobes may save power by avoiding the need to distribute a global clock. The read enable clock RE may similarly be independent from the command and address strobe signal CAS. (However, the data strobe signal DQS may be based on the RE clock for reads).

Additionally, in some embodiments, the CAS, DQS, and/or RE signals may be inactive when not in use. A clock or strobe signal may be referred to as inactive when it is at a fixed voltage, a floating voltage, or otherwise not toggling, cycling, or oscillating. For example, in a certain embodiment, the command and address strobe signal CAS may be inactive except when the on-die controller 450 receives command and address information, and the data strobe signal DQS may be inactive except when the on-die controller 450 transfers data. In certain embodiments, toggling a clock when the clock is not needed or in use may consume a significant amount of power. By contrast, deactivating CAS, DQS, and/or RE signals when not in use may save power. For example, DRAM volatile memory may use a free-running (e.g., continuous or uninterrupted) global clock to latch in command and address information and to transfer data. A latency period of tens of nanoseconds between starting the command and starting the data transfer may correspond to a small number of clock cycles, making a free-running clock reasonably practical for DRAM. By contrast, latency periods of hundreds of nanoseconds for storage class memory may correspond to a much larger number of clock cycles, so that significant power savings may be achieved by deactivating the clock(s) during the latency period.

Figure 6A:
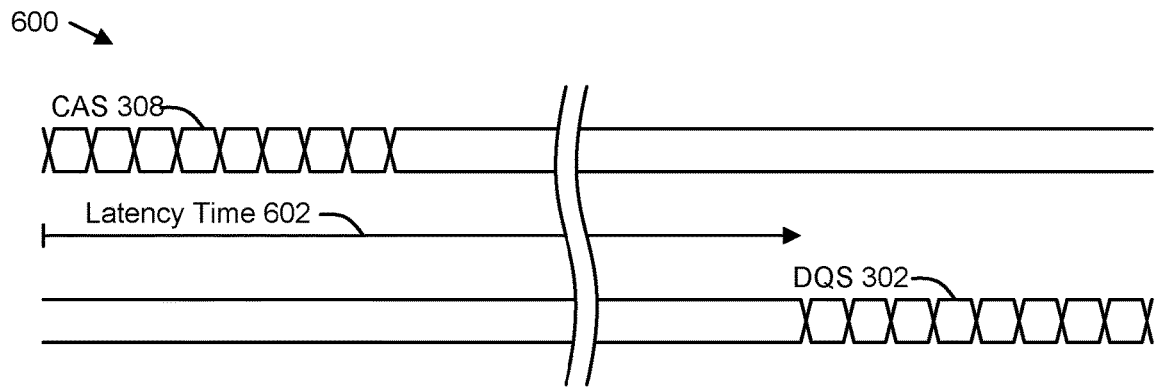
FIG. 6A is a schematic block timeline illustrating one embodiment of timing for a non-volatile memory interface.
Figure 6B:
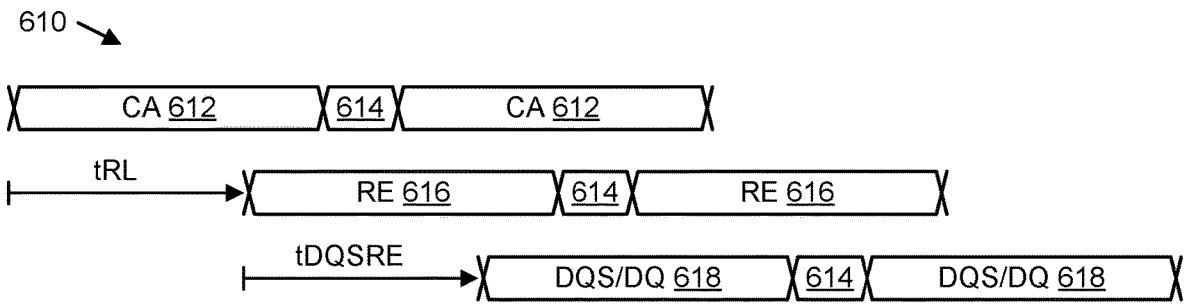
FIG. 6B is a schematic block timeline illustrating a further embodiment of timing for a non-volatile memory interface.
Figure 6C:
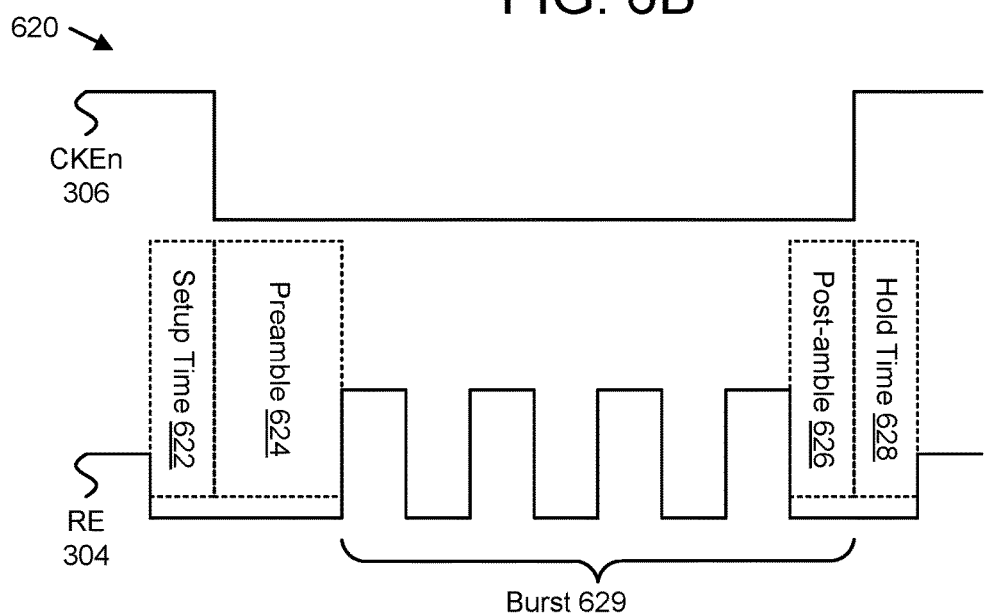
FIG. 6C is a schematic block timeline illustrating a further embodiment of timing for a non-volatile memory interface.

FIGS. 6A, 6B, and 6C depict embodiments of timelines 600, 610, 620 for a non-volatile memory interface. In general, in various embodiments, the device controller 126 sends command and address information with command and address strobe signals CAS 308. For a write operation, the device controller 126 sends data and the data strobe signal DQS 302. For a read operation, the device controller sends a read enable clock signal RE 304 to the on-die controller 450 and receives the data and the data strobe signal DQS 302 from the on-die controller 450. The on-die controller 450 may send the data strobe signal DQS 302 based on the read enable signal 304.

Thus, in the depicted embodiments, the timelines 600, 610, 620 depict signals sent by the device controller 126 (or DQS signals sent by the on-die controller 450 based on a read enable signal RE from the device controller 126). In certain embodiments, the device controller 126 may generate the command and address strobe signal CAS 308, the read enable clock signal RE 304, and/or the data strobe signal DQS 302 without sending a free-running clock signal to the one or more non-volatile memory elements 123. As described above, a free-running clock may be substantially constant and/or continuous while a device controller 126 is in a powered on state. By contrast, generating the command and address strobe signal CAS 308, the read enable clock signal RE 304, and/or the data strobe signal DQS 302 without sending a free-running clock signal to the one or more non-volatile memory elements 123 may save power by avoiding toggling various clock signals when they are not in use.

FIG. 6A depicts a timeline 600 for a write operation for a non-volatile memory interface. In the depicted embodiment, the device controller 126 sends command and address information to the on-die controller 450 in a command burst. The command burst includes four clock cycles for the command and address strobe CAS 308. (Differential signals CASt and CASc are both depicted, so that CASc is low when CASt is high, and vice versa). Using double-data rate signaling, the command burst includes eight 5-bit transfers in the four clock cycles. In another embodiment a command burst may include a different number of clock cycles, a different command bus width, or the like, so that the command burst includes a larger or smaller amount of command and address information.

After a latency time 602, the device controller 126 sends the data to be written and the data strobe signal DQS 302 in a data burst. The data burst includes four clock cycles for the data strobe DQS 302. (Differential signals DQSt and DQSc are both depicted, so that DQSc is low when DQSt is high, and vice versa). Using double-data rate signaling, the data burst includes eight 8-bit transfers in the four clock cycles, so that sixty-four bits are transferred in each data burst. In another embodiment a data burst may include a different number of clock cycles, a different data bus width, or the like, so that the data burst includes a larger or smaller amount of data.

For a read operation (not shown), the device controller 126 sends a read enable burst (e.g., four clock cycles for a read enable clock signal RE 304) after a latency time 602, and the on-die controller 450 sends the data and the data strobe signal DQS 302 in a data burst, with the data strobe signal DQS 302 based on the read enable clock signal RE 304. In various embodiments, the data strobe signal DQS 302 may be based on the read enable clock signal RE 304 in a variety of ways. For example, in a certain embodiment, the data strobe signal DQS 302 may be a delayed copy of the read enable clock signal RE 304. Delaying the read enable clock signal RE 304, in certain embodiments, may allow the on-die controller 450 to produce a data strobe signal DQS 302 with preamble times, post-amble times, and the like, that match the read enable clock signal RE 304 from the device controller 126, without adding further timing circuitry to the on-die controller 450 to generate a clock signal, produce preamble and post-amble periods, and the like. In various further embodiments, the on-die controller 450 may transform the read enable clock signal RE 304 in various further ways (e.g., by delay, amplification, or the like) to produce the data strobe signal DQS 302.

In a certain embodiment, the device controller 126 may send either the data strobe signal DQS 302 for a write operation, or the read enable clock signal RE 304 for a read operation, in response to waiting a latency time 602 after the device controller 126 initiates the command and address strobe signal CAS 308. In general, in various embodiments, a latency time 602 may refer to any measurement of time between a command and a signal for servicing the command (such as the data strobe signal DQS 302 for a write operation or the read enable clock signal RE 304 for a read operation). In some embodiments, a latency time 602 may specifically refer to the time that the device controller 126 waits between the first edge of the command and address strobe signal CAS 308 for a command and the first edge of the data strobe signal DQS 302 or read enable clock signal RE 304 for servicing the command. However, latency times 602 may be measured in a variety of ways in various further embodiments.

As an example of waiting a latency time 602, for a read operation, the device controller 126 may wait a read latency time tRL between initiating the read command and sending the read enable clock signal RE 304. Similarly, for a write operation, the device controller 126 may wait a write latency time tWL between initiating the write command and sending the data with the data strobe signal DQS 302. In certain embodiments, a latency time 602 such as a read latency or write latency may be based on an amount of time for the on-die controller 450 to be ready to send or receive data. For example, during a read latency time, the on-die controller 450 may send an address to the core array of non-volatile memory cells, and obtain read data in latches so that the read data is ready, after the read latency time, to be latched out to the device controller 126. Similarly, during a write latency time, the on-die controller 450 may decode a write address, prepare latches for receiving data, or the like. In one embodiment, the write latency time may equal the read latency time. In another embodiment, the write latency time may be greater than or less than the read latency time, depending on how much time the on-die controller 450 actually uses to prepare for data transmission for different operations. In certain embodiments, specifications for the die 202 or the on-die controller 450 may include recommended or minimum latency times 602, and the device controller 126 may wait at least the recommended or minimum latency times 602 between initiating a command and sending either the data strobe signal DQS 302 for a write operation, or the read enable clock signal RE 304 for a read operation.

For convenience in depiction, FIG. 6A omits a large portion of the latency time 602 for a write operation, between the first edge of the command and address strobe signal CAS 308 and the data strobe signal DQS 302. In certain embodiments, however, the latency time 602 may be significantly longer than the time it takes to send a command burst or a data burst. For example, with a 533 MHz clock, a clock cycle may be 1.875 ns. A command burst or a data burst may require only four clock cycles, but a latency time 602 of 150 ns may equivalent to 80 clock cycles. In certain embodiments, a latency time 602 may be specified in time units, such as nanoseconds. In another embodiment, a latency time 602 may be specified in clock cycles. In some embodiments, latency times 602 may include different numbers of clock cycles at different clock frequencies, so that the latency time 602 does not fall below a minimum latency time 602 at faster clock frequencies.

Because the latency time 602 may be significantly longer than a command burst or a data burst, separating the paths or ports for command and address information and data transfer in the first mode may allow a die 202 to receive and queue additional commands during the latency time 602. By contrast, in the second mode, where I/O pads in one port are used for both command and address information and data, the die 202 may not queue commands during a latency time 602, because the on-die controller 450 is enabling the I/O pads for data transfer during the latency time 602. Command queuing is described in further detail below with regard to FIGS. 7A and 7B.

FIG. 6B depicts a timeline 610 for read operations for a non-volatile memory interface. In the depicted embodiment, the device controller 126 sends multiple read commands in multiple read command bursts 612. For convenience in depiction, the command bursts 612, read enable bursts 616, and data bursts 618 are shown as blocks, without depicting every clock cycle. However, in various embodiments, a burst or series of clock pulses may include a fixed number of clock cycles (e.g., as depicted in FIG. 6A). As described above with regard to FIG. 6A, the device controller 450 may wait a read latency time tRL between initiating a command burst and initiating a read enable burst for servicing the command, and the on-die controller 450 may further delay the data burst by a time tDQSRE after the read enable burst begins. For convenience in depiction the actual tRL and tDQSRE times are compressed in FIG. 6B; in actuality, in certain embodiments, a read latency time tRL may be significantly longer than the command burst that sends command and address information for a read command.

In the depicted embodiment, the device controller 126 waits at least a gap time 614 (e.g., a bubble 614) between sending the command and address information for a first data operation and sending command and address information for a subsequent data operation. Although read commands are depicted, a similar gap time 614 may be applied by the device controller 126 between subsequent write commands, or when switching between read and write commands. In various embodiments, the device controller 126 waits at least a gap time 614 between sending signals for different command bursts 612, different read enable bursts 616, different data bursts 618, or the like.

In various embodiments, a gap time 614 may refer to any measurement of the time between command bursts 612. For example, in a certain embodiment, the gap time 614 refers to a time, a number of clock cycles, or the like between the end of one command burst 612 and the start of another command burst 612. However, in another embodiment, gap times 614 may be measured between starts of command bursts 612. In one embodiment, waiting a gap time 614 between command bursts 612 may avoid contention between die 202, when a first command is sent to a first die 202 and a second command is sent to a second die 202. In another embodiment, waiting a gap time 614 between read and write commands may provide time to switch control of the data channel between the on-die controller 450 and the device controller 126. In certain embodiments, a gap time 614 may be small (e.g., less than 10 ns, less than 10 clock cycles, or the like) compared to a latency time 602.

The controller 126 may determine a length for a gap time 614 (e.g., a bubble 614) based on a die 202 for the different commands 612, a bank 206 for the different commands 612, a rank 212 for the different commands 612, a sub-array 208 for the different commands, a type of the different commands 612, and/or another factor affecting timing. For example, the controller 126 may select a gap time 614 to avoid contention of multiple die 202, banks 206, sub-arrays 208, ranks 212, or the like on a bus or other line (e.g., one or more data strobe lines DQS 302, a data bus DQ 302, or the like); based on a read latency and/or a write latency; based on an I/O control time to switch to another die 202, bank group 204, bank 206, sub-array 208, rank 212, or the like; based on an internal data path conflict within a die 202; based on a time to switch between command types (e.g., read to write, write to read); and/or based on another timing factor. For example, in certain embodiments, the gap time 614 may be zero for reads for a single rank 212, between sending read commands bursts 612 for the single rank 212, between sending different read enable bursts 616 for the single rank 212, and/or between sending different data bursts 618 for the single rank 212.

FIG. 6C depicts one embodiment of a timeline 620 for enabling a read operation for a non-volatile memory interface. In general, in various embodiments, strobe or clock signals such as the command and address strobe signal CAS 308, the read enable clock signal RE 304 and the data strobe signal DQS 302 are gated based on enable signals so that the strobes are only valid internally within a non-volatile memory element 123 and/or a die 202 when enabled by the enable signal. In various embodiments, an enable signal may refer to any signal that enables or disables a die 202 (or rank or group of dies 202) for receiving command and address information, or for transferring data. For example, in certain embodiments, an enable signal may include a chip enable signal CEn 310 (that gates the command and address strobe signal CAS 308), a rank group clock enable signal CKEG (that selects a rank or group of dies 202 for data operations), and/or a clock enable signal CKEn 306 (that gates the read enable clock signal RE 304 and/or the data strobe signal DQS 302 for data transfers), or the like.

As an example of strobe or clock signals gated by enable signals, FIG. 6C depicts the read enable RE 304 input gated by the clock enable signal CKEn 306, so that the read enable RE 304 input is only valid internally within a non-volatile memory element 123 and/or a die 202 when the clock enable signal CKEn 306 is low. In another embodiment, a strobe signal may be valid only when the enable signal is high. Various ways of using enable signals to gate inputs will be clear in view of this disclosure.

In certain embodiments, the device controller 126 may wait at least a predefined preamble time 624 between sending an enable signal and sending the corresponding strobe or clock signal (e.g., the command and address strobe signal CAS 308, the read enable clock signal RE 304, and/or the data strobe signal DQS 302). Because, in certain embodiments, there is no free running clock from the device controller 126, or the like, a predefined amount of time may be included to account for a timing uncertainty of the clock enable signal CKEn 306, such as the depicted setup time 622 and/or preamble time 624. The device controller 126, in one embodiment, waits at least a setup time 622 and/or a preamble time 624 before sending a strobe signal to latch in or out data on a read enable RE line 304 (e.g., for a read operation) and/or a data strobe DQS line 302 (e.g., latching in for a write operation, latching out for a read operation, or the like). The device controller 126, in certain embodiments, may wait at least a post-amble time 626 and/or a hold time 628 after sending a strobe signal to latch in or out data on a read enable RE line 304 and/or a data strobe DQS line 302, before sending another strobe signal.

In the depicted embodiment, a read enable burst 629 includes four clock cycles for the read enable clock signal RE 304. (In another embodiment, however, a burst 629 may include a different number of clock cycles). In a certain embodiment, a preamble time 624 may refer to a measurement of the time between sending the enable signal and starting the burst 629. In some embodiments, the preamble time 624 may be predefined. For example, in a certain embodiment, the preamble time 624 may be based on time for the on-die controller 450 to prepare for the strobe signal after receiving the enable signal, and the specifications for the die 202 or the on-die controller 450 may include a recommended preamble time 624, a recommended range for the preamble time 624, a minimum preamble time 624, or the like.

Figure 7A:
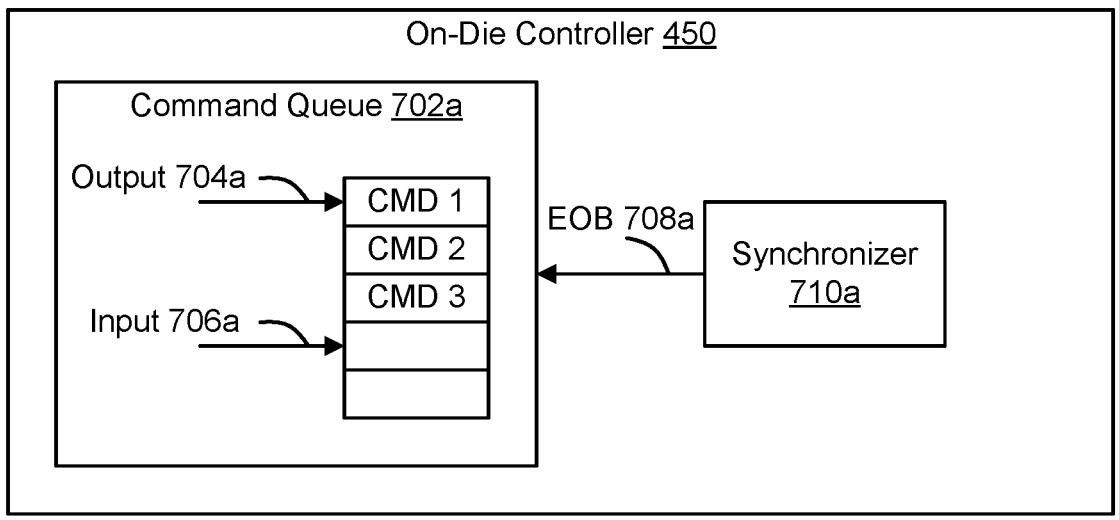
FIG. 7A is a schematic block diagram illustrating one embodiment of an on-die controller for a non-volatile memory.
Figure 7B:
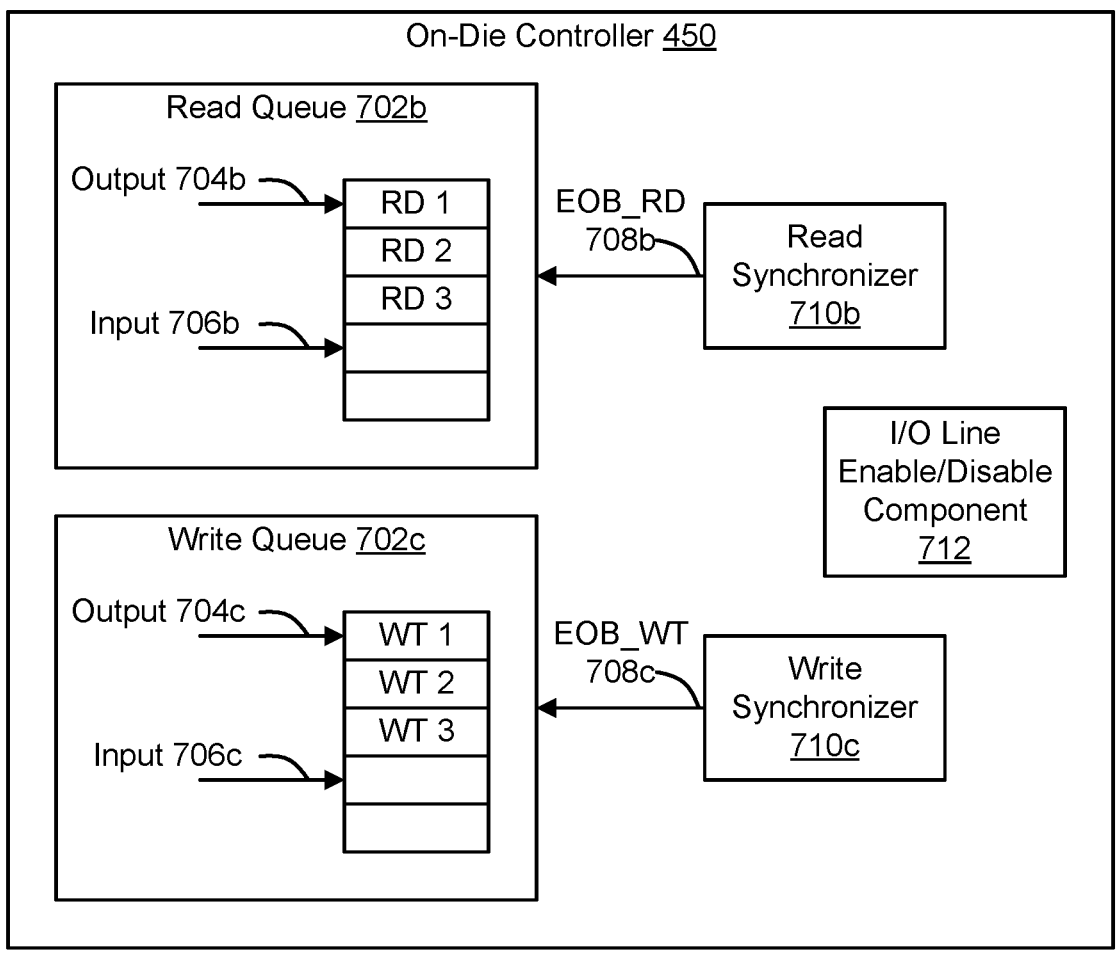
FIG. 7B is a schematic block diagram illustrating another embodiment of an on-die controller for a non-volatile memory.

FIGS. 7A and 7B depict embodiments of an on-die controller 450 for a non-volatile memory. In the depicted embodiments, the on-die controller 450 includes one or more command queues 702, and one or more synchronizers 710. In certain embodiments, as depicted in FIG. 7B, the on-die controller 450 further includes an I/O line enable/disable component 712.

In general, in various embodiments, the on-die controller 450 queues a plurality of commands at an input stage 706 of a command queue 702, services a command from an output stage 704 of the command queue 702 in response to a burst or series of clock pulses from a device controller 126, and shifts the output stage 704 of the command queue 702 to a subsequent command in response to a count of the clock pulses satisfying a threshold. In certain embodiments, queuing commands may allow the on-die controller 450 to receive subsequent commands during a latency period for a first command, while transferring data for a first command, or the like.

The command queue 702 may include a FIFO, a ring buffer, a range of volatile memory, a set of latches, or the like, configured to queue commands. The command queue 702, in certain embodiments, comprises a first-in-first-out (FIFO) queue, an asynchronous FIFO queue, or the like. In one embodiment, as depicted in FIG. 7A, read and write commands may be queued in or tracked by a single command queue 702a. In another embodiment, as depicted in FIG. 7B, the on-die controller 450 may include a separate read command queue 702b and write command queue 702c, for queuing read and write commands separately. In another embodiment, the command queue 702 may queue and/or track one or more system, control, and/or administrative commands.

In one embodiment, commands queued by the command queue 702 may include command and address information received via the first port 152. In a further embodiment, the command queue 702 may include further information about commands, such as fields indicating whether a command has been started, successfully completed, or the like. In another embodiment, addresses may be queued separately, and the command queue 702 may simply track whether a command is a read or write command. For example, a queue 702 of single-bit latches may indicate whether commands are for reading or writing data.

In certain embodiments, an input stage 706 may refer to a location in the command queue 702 where incoming commands are received (e.g., the tail of the queue 702). For example, in one embodiment, an input stage 706 may refer to a pointer to the first empty space in the queue 702. The input stage 706 may move or shift as additional commands are received. Similarly, in certain embodiments, an output stage 704 may refer to a location in the command queue 702 from which commands are serviced (e.g., the head of the queue 702). For example, in one embodiment, an output stage 704 may refer to a pointer to the first unserviced command in the queue 702. The output stage 704 may move or shift as commands are serviced.

The command queue 702, in certain embodiments, may receive and queue multiple commands on the first port 152 before starting to transfer or toggle data on the second port 154, thereby providing parallelism by executing multiple commands at once (e.g., simultaneously, in a pipeline, or the like). A command and address decoder may determine a type of command (e.g., a read command, a write command, a control command, or the like) and send an indicator of the type of command to the command queue 702. The command queue 702 may have a predefined size based on the number of commands which the command queue 702 may track and/or queue, such as 2 commands, 4 commands, 8 commands, 16 commands, 32 commands, 48 commands, 64 commands, or the like.

In one embodiment, the on-die controller 450 may service a command from an output stage 704 of the command queue 702 in response to a burst or series of clock pulses from a device controller 123. In various embodiments, servicing a read or write command may include transferring the data for the command. For example, if the command at the output stage 704 is a read command, the on-die controller 450 may service the read command in response to a burst or series of clock pulses for the read enable clock signal RE 304. Similarly, if the command at the output stage 704 is a write command, the on-die controller 450 may service the write command in response to a burst or series of clock pulses for the data strobe signal DQS 302. A burst or series of clock pulses may include a predetermined number of pulses for a command burst or a data burst. For example, a burst or series of clock pulses for a 64 bit data burst may refer to a sequence of four clock pulses (eight transfers, using double data rate signaling) on an eight bit data bus. In another embodiment, a burst or series of clock pulses may refer to a different number of clock pulses, depending on the amount of information to be transferred, the width of the bus, whether double data rate signaling is used or not, or the like. In certain embodiments, servicing commands in bursts may provide fast, random access or byte-addressable data transfers for storage class memory.

In one embodiment, the on-die controller 450 may shift the output stage 704 of the command queue 702 to a subsequent command in response to a count of the clock pulses satisfying a threshold. In one embodiment, shifting the output stage 704 may refer to shifting a pointer to the next command in the queue 702. In another embodiment, shifting the output stage 704 may refer to deleting a command, and shifting commands forward in the queue 702. A threshold for shifting the output stage 704, in certain embodiments, may refer to a predefined number of clock pulses for a burst or series of clock pulses. For example, if a burst or series of clock pulses is defined to include four clock pulses, the threshold may be satisfied when the fourth clock pulse is complete.

In a certain embodiment, the synchronizer 710 may count clock pulses in a burst or series of clock pulses, and send an end of series and/or end of burst signal EOB 708 to the command queue 702 in response to the count of the clock pulses satisfying the threshold, so that shifting the output stage 704 of the command queue 702 is in response to the end of series/end of burst signal. In some embodiments, as depicted in FIG. 7B, where the on-die controller 450 includes a read command queue 702b and a write command queue 702c, the on-die controller 450 may further include a read synchronizer 710b that counts pulses for the read enable clock signal RE and sends an end of series/end of burst read signal EOB_RD 708b to the read command queue 702b for moving the output stage 704b, and a write synchronizer 710c that counts pulses for the data strobe signal DQS and sends an end of series/end of burst write signal EOB_WT 708c to the write command queue 702c for moving the output stage 704c.

In various embodiments, an end of series/end of burst signal 708 may refer to any signal sent to the command queue 702 that indicates that that a burst or series of clock pulses is complete, or that the count of the clock pulses satisfies the threshold. In some embodiments, using a synchronizer 710 to count clock cycles and send an end of series/end of burst signal 708 to a command queue 702 allows the on-die controller 450 to service subsequent commands in the command queue 702 without waiting for any indication (apart from the end of the clock burst) from the device controller 126 that a first command has been finished.

The command queue 702 may comprise one or more end of series/end of burst inputs, which synchronizer(s) 710 may use to indicate to the command queue 702 that a burst operation is complete. For example, the read synchronizer 710b may count read enable pulses (e.g., 4 pulses, 8 pulses, 16 pulses, 24 pulses, 32 pulses, 64 pulses, or the like) and may send the read command queue 702b an end of series/end of burst read signal 708b (e.g., a pulse, a state transition, an end of series/end of burst indicator added to the read command queue 702b, and/or another predefined signal), causing the read command queue 702b to move an output pointer or stage 704b to the next command in the read command queue 702b. In a further embodiment, the write synchronizer 710c may count data strobe pulses (e.g., 4 pulses, 8 pulses, 16 pulses, 24 pulses, 32 pulses, 64 pulses, or the like) and may send the write command queue 702c an end of series/end of burst write signal 708c (e.g., a pulse, a state transition, an end of series/end of burst indicator added to the write command queue 702c, and/or another predefined signal), causing the write command queue 702c to move an output pointer or stage 704c to the next command in the write command queue 702c.

The command queue 702 may receive one or more inputs, such as an input pointer clock, a read command, a write command, a control command, an end of series/end of burst read signal 708b, an end of series/end of burst write signal 708c, or the like. Additionally, the command queue 702 may provide one or more outputs, such as an output pointer clock, a read enable output, a write enable output, or the like. In certain embodiments, a command and address decoder introduces a delay before providing a command to the command queue 702, to account for a read latency, a write latency, or the like.

In certain embodiments, the on-die controller 450 may use an I/O line enable/disable component 712 to enable and/or disable one or more input/output lines based on the command from the output stage 704 of the command queue 702. In various embodiments, an input/output line may be connected to contacts 550 of the first port 152 or the second port 154. Enabling an input/output line may refer to configuring the line to send or receive information. Similarly, disabling an input/output line may refer to configuring the line to neither send nor receive information. For example, in various embodiments, an input/output line may be enabled for sending by coupling and/or connecting the line to a component that sends data, enabled for receiving by coupling and/or connecting the line to a component that receives data, or disabled by decoupling and/or disconnecting the line, or simply by ignoring signals on the line.

In various embodiments, enabling or disabling input/output lines based on the command from the output stage 704 of the command queue 702 may prepare the on-die controller 450 for servicing the command and transferring the associated data. For example, in one embodiment, where the command from the output stage 704 of the command queue 704 is a read command, the on-die controller 450 enables one or more input/output lines for receiving a read enable clock signal and for sending data and data strobe pulses, and disables one or more input/output lines for receiving write data and data strobe pulses, in response to the read command. In another embodiment, where the command from the output stage 704 of the command queue 702 is a write command, the on-die controller 450 enables one or more input/output lines for receiving write data and data strobe pulses, and disables one or more input/output lines for receiving a read enable clock signal and for sending data and data strobe pulses, in response to the write command. In further embodiments, various other electrical contacts 550 of the second port 154 may be enabled or disabled by the on-die controller 450 based on a state of the command queue 702 and/or associated commands.

Figure 8:
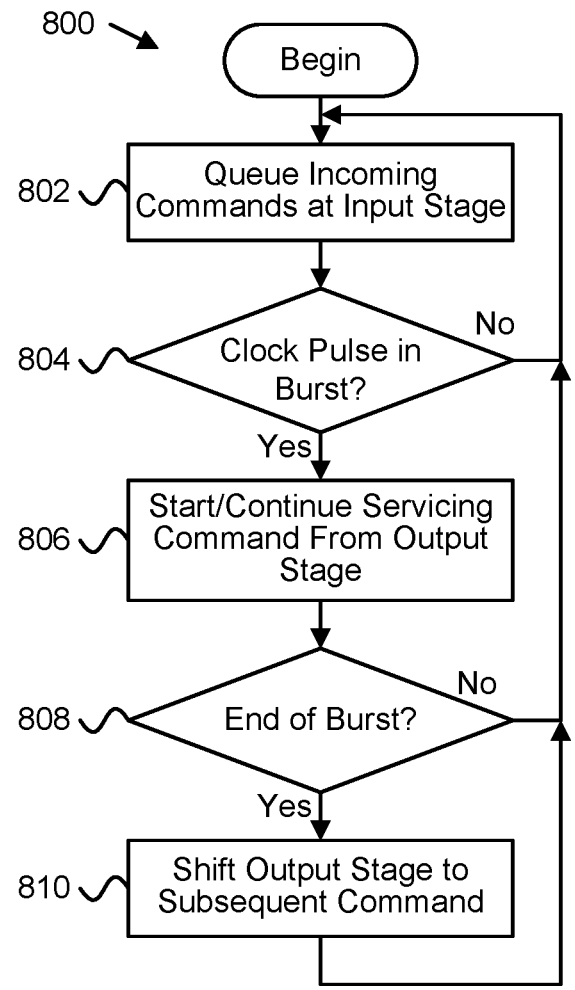
FIG. 8 is a schematic flow chart diagram illustrating one embodiment of a method for managing a command queue for non-volatile memory.

FIG. 8 depicts a method 800 for managing a command queue for non-volatile memory. The method 800 begins, and an on-die controller 450 queues incoming commands at an input stage 706 of a command queue 702. In response to receiving 804 a clock pulse in a burst or series of clock pulses, the on-die controller 450 starts (or continues) servicing 806 a command from an output stage 704 of the command queue 702. If no clock pulses are received 804, the on-die controller 450 continues to queue 802 incoming commands, and the method 800 continues.

A synchronizer 710 determines 808 whether the end of the burst or series of clock pulses has been reached (e.g., whether the count of clock pulses satisfies a threshold). If not, the method 800 continues with the on-die controller 450 continuing to queue 802 any incoming commands, and continuing to service 806 the command from the output stage 704 of the command queue 702 in response to receiving 804 subsequent clock pulses. If the synchronizer 710 determines 808 that the end of the burst or series of clock pulses has been reached (e.g., that the count of clock pulses satisfies a threshold), then the on-die controller 450 shifts 810 the output stage 704 of the command queue 702 to a subsequent command, and the method 800 continues.

A means for queuing a plurality of commands, in various embodiments, may include a command queue 702a, a read command queue 702b, a write command queue 702c, an on-die controller 450, a FIFO, a ring buffer, a range of memory locations, other logic hardware, and/or other executable code stored on a computer readable storage medium. Other embodiments may include similar or equivalent means for queuing commands.

A means for servicing a command, in various embodiments, may include, an on-die controller 450, a control and address decoder, a core array of non-volatile memory cells, an internal data bus, data latches, one or more multiplexers, one or more serializer-deserializers, other logic hardware, and/or other executable code stored on a computer readable storage medium. Other embodiments may include similar or equivalent means for servicing commands.

A means for shifting an output stage 704 of a command queue 702, in various embodiments, may include, an on-die controller 450, a command queue 702, a synchronizer 710, a register or buffer that increments a pointer in response to an end of series/end of burst signal 708, other logic hardware, and/or other executable code stored on a computer readable storage medium. Other embodiments may include similar or equivalent means for shifting an output stage 704.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   one or more memory die, a memory die comprising:
      an array of non-volatile memory cells;
      a set of ports, the set of ports comprising a first port and a second port, the first port comprising a first plurality of electrical contacts and the second port comprising a second plurality of electrical contacts; and
      an on-die controller configured to communicate via the first port and the second port to receive command and address information and to transfer data for data operations on the array of non-volatile memory cells, the on-die controller using the first port to receive command and address information and the second port to transfer data in a first mode and using the first port to receive command and address information and to transfer data while the second port is inactive in a second mode, the second mode providing compatibility with an interface of a legacy type of memory die.

2. The apparatus of claim 1, the first mode comprising a storage class memory interface wherein the on-die controller receives the command and address information via the first port, and transfers the data via the second port.

3. The apparatus of claim 1, the second mode providing a NAND storage interface wherein the on-die controller both receives the command and address information and transfers the data via the first port.

4. The apparatus of claim 1, wherein the on-die controller uses at least one set of contacts of the set of ports for single-ended input/output, and uses at least one pair of contacts of the set of ports for a differential strobe.

5. The apparatus of claim 1, wherein the on-die controller receives the command and address information according to a command and address strobe signal received via one or more command and address strobe lines of the set of ports, and transfers the data according to a data strobe signal communicated via one or more data strobe lines of the set of ports, the command and address strobe signal independent from the data strobe signal.

6. The apparatus of claim 5 wherein the command and address strobe signal is inactive except when the on-die controller receives command and address information, and the data strobe signal is inactive except when the on-die controller transfers data.

7. The apparatus of claim 5, further comprising a device controller that:
   sends the command and address information and the command and address strobe signal;
   for a write operation, sends the data and the data strobe signal; and
   for a read operation, sends a read enable clock signal and receives the data and the data strobe signal, the data strobe signal sent by the on-die controller based on the read enable clock signal.

8. The apparatus of claim 7, wherein the device controller generates one or more of the command and address strobe signal, the read enable clock signal, and the data strobe signal without sending a free-running clock signal to the one or more memory die.

9. The apparatus of claim 7, wherein the device controller sends one of the data strobe signal and the read enable clock signal in response to waiting a latency time after initiating the command and address strobe signal for a data operation.

10. The apparatus of claim 7, wherein the device controller waits at least a gap time between sending the command and address information for a data operation and sending command and address information for a subsequent data operation.

11. The apparatus of claim 7, wherein the device controller waits at least a predefined preamble time between sending an enable signal and sending one or more of the command and address strobe signal, the read enable clock signal, and the data strobe signal.

12. The apparatus of claim 1, wherein the on-die controller queues a plurality of commands at an input stage of a command queue, services a command from an output stage of the command queue in response to a burst of clock pulses from a device controller, and provides an end of burst signal to the command queue to shift the output stage of the command queue to a subsequent command in response to a count of the clock pulses satisfying a threshold.

13. An apparatus comprising:
   a memory die comprising:
      an array of non-volatile memory cells;
      a first port and a second port; and
      a controller configured to:
         use the first port to receive command and address information and the second port to transfer data in a first mode, and use the first port to receive command and address information and to transfer data while the second port is inactive in a second mode;
         queue a plurality of commands, for data operations on the array of non-volatile memory cells, at an input stage of a command queue;
         service a command from an output stage of the command queue in response to a series of clock pulses from a device controller; and
         shift the output stage of the command queue to a subsequent command in response to a count of the clock pulses satisfying a threshold.

14. The apparatus of claim 13, wherein the controller comprises a synchronizer that counts the clock pulses and adds an end of series indicator to the command queue in response to the count of the clock pulses satisfying the threshold, wherein shifting the output stage of the command queue is in response to the end of series indicator.

15. The apparatus of claim 13, wherein the controller comprises a first command queue for queuing read commands and a second command queue for queuing write commands.

16. The apparatus of claim 13, wherein the controller enables one or more input/output lines based on the command from the output stage of the command queue.

17. The apparatus of claim 16, wherein the command from the output stage of the command queue is a read command and the controller enables one or more input/ output lines for receiving a read enable clock signal and for sending data and data strobe pulses, and disables one or more input/output lines for receiving write data and data strobe pulses, in response to the read command.

18. The apparatus of claim 16, wherein the command from the output stage of the command queue is a write command and the controller enables one or more input/output lines for receiving write data and data strobe pulses, and disables one or more input/output lines for receiving a read enable clock signal and for sending data and data strobe pulses, in response to the write command.

19. A system comprising:
one or more memory die, a memory die comprising:
- an array of non-volatile memory cells;
- a set of ports, the set of ports comprising a first port and a second port, the first port comprising a first plurality of electrical contacts and the second port comprising a second plurality of electrical contacts; and
- an on-die controller that queues a plurality of commands at an input stage of a command queue, services a command from an output stage of the command queue in response to a burst of clock pulses from a device controller, and shifts the output stage of the command queue to a subsequent command in response to a count of the clock pulses satisfying a threshold; and
- a device controller that communicates with the on-die controller for a selected die via the first port and the second port to send command and address information and to transfer data for data operations on the selected die, wherein the device controller uses the first port for command and address information and the second port for data in a first mode, and uses the first port for command and address information and data while not using the second port in a second mode, the second mode providing compatibility with an interface of a legacy type of memory die.

20. The system of claim 19, wherein:
the first mode comprises a storage class memory interface wherein the device controller sends the command and address information via the first port, and transfers the data via the second port; and
the second mode comprises a NAND storage interface wherein the device controller both sends the command and address information and transfers the data via the first port.

* * * * *